United States Patent
Wakata et al.

(10) Patent No.: US 7,041,416 B2
(45) Date of Patent: *May 9, 2006

(54) PHOTOSENSITIVE RESIN COMPOSITION, TRANSFER MATERIAL, IMAGE FORMING METHOD, COLOR FILTER AND PRODUCING METHOD THEREOF AND PHOTOMASK AND PRODUCING METHOD THEREOF

(75) Inventors: Yuichi Wakata, Shizuoka-ken (JP); Takashi Takayanagi, Shizuoka-ken (JP); Naoya Imamura, Shizuoka-ken (JP); Mizuki Yamamoto, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 200 days.

This patent is subject to a terminal disclaimer.

(21) Appl. No.: 10/277,171

(22) Filed: Oct. 22, 2002

(65) Prior Publication Data

US 2003/0129504 A1    Jul. 10, 2003

(30) Foreign Application Priority Data

Oct. 22, 2001  (JP) ............................. 2001-323648

(51) Int. Cl.
*G02B 5/20* (2006.01)

(52) U.S. Cl. .......................... 430/5; 430/7; 430/287.1; 430/325; 430/330

(58) Field of Classification Search ............. 430/287.1, 430/5, 7, 325
See application file for complete search history.

(56) References Cited

U.S. PATENT DOCUMENTS 5,811,219 A * 9/1998 No et al. ................ 430/287.1
2003/0091908 A1 * 5/2003 Takayanagi .................... 430/5

FOREIGN PATENT DOCUMENTS

| JP | 52-048521 | 4/1977 |
| JP | 59-220731 | 12/1984 |
| JP | 60-112035 | 6/1985 |
| JP | 62-048819 | 3/1987 |
| JP | 62-285903 A * | 12/1987 |
| JP | 63-040141 | 2/1988 |
| JP | 01-019572 | 1/1989 |
| JP | 2-023351 A * | 1/1990 |
| JP | 02-023551 | 1/1990 |
| JP | 04-194941 | 7/1992 |
| JP | 05-281734 | 10/1993 |
| JP | 06-011831 | 1/1994 |
| JP | 07-325400 | 12/1995 |
| JP | 08-101498 | 4/1996 |
| JP | 08-101505 | 4/1996 |
| JP | 09-080225 | 3/1997 |
| JP | 09-269409 | 10/1997 |
| JP | 10-090510 | 4/1998 |
| JP | 63-285903 | 11/1998 |
| JP | 2000-154207 | 6/2000 |
| JP | 2000-292615 | 10/2000 |
| JP | 3120476 | 10/2000 |
| JP | 2001-66412 | 3/2001 |
| JP | 2001-066772 | 3/2001 |

* cited by examiner

Primary Examiner—John A. McPherson
(74) Attorney, Agent, or Firm—Sughrue Mion, PLLC

(57) ABSTRACT

The invention provides a colored photosensitive resin composition for forming a colored image on a transparent substrate, the colored photosensitive resin composition comprising: an alkali-soluble binder, one of a monomer and an oligomer having at least two ethylenic unsaturated double bonds, one of a photopolymerization initiator and a photopolymerization initiating system, and a pigment, said alkali-soluble binder comprising a copolymer including a structural unit having a carboxyl group, a structural unit represented by the following general formula (1), and a structural unit comprising a (meth)acrylate having at least one of an aromatic ring and an alicyclic ring:

General formula (1)

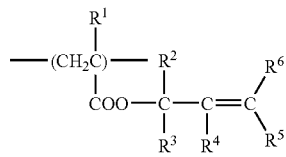

wherein $R^1$ represents one of a hydrogen atom and a methyl group; and each of $R^2$ to $R^6$ independently represents one of a hydrogen atom, a substituted and unsubstituted alkyl group, a substituted and unsubstituted aryl group, a halogen atom and a cyano group.

25 Claims, 2 Drawing Sheets

PHOTOSENSITIVE RESIN COMPOSITION, TRANSFER MATERIAL, IMAGE FORMING METHOD, COLOR FILTER AND PRODUCING METHOD THEREOF AND PHOTOMASK AND PRODUCING METHOD THEREOF

BACKGROUND OF THE INVENTION

1. Field of the Invention

The present invention relates to a photosensitive colored resin composition, a transfer material, and an image forming method, and more specifically relates to a resin composition and a transfer material for forming a colored image such as a color filter to be used in a liquid crystal display device or the like or a photomask to be used in a photolithographic process, an image forming method suitable for forming a colored image by a lamination method, and a color filter and a photomask thus obtained.

2. Description of the Related Art

Photosensitive resin compositions have long been used in various image forming materials. In particular, photosensitive colored resin compositions including a coloring component such as a dye or a pigment in such photosensitive resin compositions are widely utilized in forming various colored images such as a paint, an ink or a printing proof material.

Also a method of coating and drying a photosensitive resin composition in advance on a film support to form as a filmed resist, and transferring the photosensitive resin layer from the support to a substrate is called a transfer method, which has advantages that a thin film with a high quality can be formed highly efficiently. Such method is described for example in the JP-A (Japanese Patent Application Laid-Open) Nos. 5-39450, 5-72724, 6-80503 and 9-197665, and there is disclosed an example of forming a colored image such as a color filter by such method.

Also in recent years, this transfer method is also used in the uses requiring various resistances such as image hardness, chemical resistance, light fastness, scratch resistance and the like in the obtained image, such as a color filter employed in a liquid crystal display device or a mask material. For example, the color filter is required to have a high heat resistance, a high hardness and a high solvent resistance because it is subjected, in a panel forming process after the preparation of the color filter, to application of a transparent orienting film thereon and to a step of adhesion to an opposing substrate and injection of liquid crystal.

A Cr mask having a metallic chromium layer and an Em mask (emulsion mask) having a layer of silver halide emulsion are also known as the photomask material employed in a photolithographic process in the fields of the flat panel display, the shadow mask for CRT, the printed circuit board and the semiconductors, as described in "Photofabrication" (Japan Photofabrication Association, edited by Kyoiku Bunka Kai, pp67–80, June 1992).

The metal Cr mask is prepared by formation of a chromium layer by sputtering it on a transparent substrate such as of quartz or glass, then formation of an etching resist thereon by coating and the like, exposure for example with a HeCd laser (442 nm), patterning of the etching resist by development with aqueous alkali solution, etching of chromium and peeling of the etching resist. Such Cr mask has the advantages of defect repairability, high resolution, high durability (scratch resistance) and excellent washability, but is very expensive because of the complex preparing process thereof, and requires chromium etching in the preparing process thereby not only leading to a cost increase because of the required waste treatment but also being undesirable environmentally.

On the other hand, the Em mask can be prepared by providing a silver halide emulsion on a transparent substrate such as of quartz or glass, then exposure with a YAG laser or the like, development and fixation. Such photomask material requires only a small exposure energy (about 0.1 mJ/cm$^2$) because of the high optical sensitivity of the emulsion, is environmentally safe and inexpensive. However, it cannot provide a very high resolution because silver halide is used as the photosensitive material, and is insufficient in durability because the photosensitive layer is composed of a gelatin film. Also the repairing of a defect in the photomask is practically difficult.

In consideration of the foregoing, there is desired a photomask material which is safe and inexpensive and has excellent durability (scratch resistance), and enables easy defect repairing.

In order to realize such various resistances in the photosensitive resin composition, there is generally utilized a negative composition which can improve the film strength in the image forming process including for example an image-wise exposure and a development. It is also effective to carry out a process after the image formation (such as a post-heating or a post-exposure) thereby further advancing the crosslinking or hardening reaction in the resin layer.

The negative photosensitive resin composition is generally composed of a binder resin, a photopolymerizable polyfunctional monomer, a photopolymerization initiator and the like. The binder resin is usually alkali developable, and generally includes an acidic group such as carboxylic acid. Various investigations have been made in order to improve the resistances after hardening of such resin compositions.

For example there is known a method using a thermal crosslinking agent which reacts with a carboxylic acid and the like in combination with the aforementioned resin component. More specifically, JP-A No. 57-178237 discloses a photosensitive resin composition including a binder (containing a carboxyl group), a polyfuntional monomer, a photopolymerization initiator and a compount containing at least two epoxy groups in a molecule, and JP-A No. 2000-181058 discloses a photosensitive resin composition including a resin containing a carboxyl group and an ethylenic unsaturated group, an epoxy resin, a photopolymerization initiator and an inorganic filler.

There is also known a case including such thermally crosslinkable group in the binder. For example JP-A Nos. 2000-81701 and 10-316721 disclose photosensitive resin compositions including a copolymer obtained from a monomer having a carboxyl group, a monomer having an epoxy group and another monomer.

However, though such compositions improve the strength of the hardened film by the exposure and the heating thereafter, they are insufficient in the stability with time, and have a drawback that the composition becomes hardened even prior to use thereof by the proceeding of a thermal reaction in the course of a prolonged storage.

In order to resolve such drawbacks, there is known a case employing a block isocyanate compound which is a precursor of an isocyanate group, as a new hardener. For example JP-A Nos. 3-50549, 7-278254, 8-15861, 10-20505 and 10-148938 disclose a composition including a binder resin having a carboxyl group, a polyfunctional monomer, a photopolymerization initiator, and a block compound of polyfunctional isocyanate. Though such hardeners have a significantly improved stability with time, in comparison with the conventional epoxy hardeners, but they are in fact inferior in the hardening property and are unsatisfactory in the resistances such as chemical resistance and hardness.

On the other hand, there is also investigated a method of introducing a reactive group, particularly a photopolymerizable functional group into the binder resin. Such binder resin is already known, and for example JP-B (Japanese Patent Application Publication) Nos. 50-34444 and 51-39847 and JP-A Nos. 53-097416 and 2-230154 disclose photosensitive resin compositions including a resin in which a polymerizable group is introduced by adding a compound having an epoxy group and a polymerizable group to a polymer having a carboxyl group. However, these methods are defective in that a compound having an epoxy group and a polymerizable group which involve concern in safety is used and in that such compound remains in the system because the aforementioned addition reaction is a reaction of high-molecule and scarcely proceeds completely.

Also the resin having a polymerizable group is widely employed in the solder resist. Representative examples include compositions utilizing a resin obtained by modifying novolac type epoxy resin as disclosed in JP-B No. 1-54390 and the like, and those utilizing a resin obtained by modifying a resin having an anhydride with a polymerizable compound having a hydroxyl group as disclosed in JP-A No. 2-23351 and the like. However these compositions basically include an epoxy compound as the thermal hardening component and are therefore insufficient in stability with time.

Also JP-A Nos. 2000-105456, 2000-250217 and 2000-298339 disclose examples of a composition employing an addition product of a polymer having a carboxyl group and a compound having a (meth)acryloyl group and an isocyanate group, and examples of application thereof to the color filter. However, also in this case, there is required an epoxy group in the resin or an epoxy resin as an additive component in order to ensure the hardening property, so that the stability with time is insufficient.

On the other hand, there is also disclosed a case not employing the thermally hardening component.

At first, with respect to the kind of the polymerizable group, for example the Japanese Patent No. 3120476 discloses a colored paste for color filter, utilizing a resin having a carboxyl group and a (meth)acryloyl group and including styrene as the copolymerization component, and JP-A No. 9-80225 discloses a resin having a carboxyl group and a cinnamoyl group or the like. Also JP-A No. 2000-154207 discloses a photosensitive resin composition for color filter, utilizing a resin having an acryloyl group and a carboxyl group. Also the JP-A No. 60-112035 discloses a solder resist including a linear polymer having a double bond in a side chain, and describes that a (meth)acryloyl group is preferable also in this case.

In addition to the foregoing, JP-A No. 49-120703 and JP-B Nos. 63-41923 and 1-7649 disclose examples of the photosensitive resin composition utilizing a resin having a reactive group such as an azide group, a cinnamate ester, a chalcone, a stilbazolium or a styryl quinolium.

However, among these conventional technologies considered in terms of the polymerizable reactive group, the most representative (meth)acryloyl group has a drawback of easily reacting at the stage of synthesis because of its high polymerizability but having a still insufficient hardening ability when introduced into the resin. Also the cinnamate ester, chalcone, stilbazolium or styrylquinoline results in a low sensitivity because of insufficient reactivity and cannot provide sufficient hardness and chemical resistance even after hardening. Also the azide group has explosivity during preparation.

Also with respect to the synthesizing method, JP-A 1-19572 discloses a photosensitive resin composition utilizing a resin formed by an addition of a compound having an epoxy group and a polymerizable group to a copolymer of (meth)acrylic acid and a (meth)acrylate having a specific ring structure. Also JP-A Nos. 63-40141 and 4-194941 disclose a photosensitive recording element and a colored image forming material utilizing a reaction product of a copolymer of (meth)acrylic acid with glycidyl (meth)acrylate. Further, JP-A Nos. 59-220731, 62-285903, 2001-66412, 2001-66772 and the like disclose photosensitive resin compositions utilizing a resin formed by addition of a compound having a hydroxyl group and a polymerizable group to a resin having an anhydride ring. There is also described an example (resin having a carboxyl group and a polymerizable group) utilizing a resin formed by reacting a maleic acid copolymer with a compound having a hydroxyl group and a polymerizable group (allyl, cinnamyl or (meth)acrylate) or a compound having an epoxy group and a polymerizable group (allyl, cinnamyl or (meth)acrylate).

However, among these conventional technologies considered in terms of the synthesizing method, the addition of a compound having a hydroxyl group and a polymerizable group to an anhydride can be most easily and most commonly achieved by a method of adding a compound having a hydroxyl group and a (meth)acryloyl group, but such method results in an insufficient hardening property as explained in the foregoing. Also the reactivity is similarly insufficient in the case of utilizing a cinnamyl group. In the case of utilizing an allyl group, the most common raw material is allyl alcohol, but this material is toxic and difficult to use in the manufacture. Also in the case of adding a compound having an epoxy group and a polymerizable group to a resin having a carboxyl group, such compound has a concern in terms of the safety.

The present inventors have found that an allyl group, which cannot be generally considered a compound having a high polymerizing ability, has an excellent hardening property after introduction into a resin, particularly has an excellent hardening property by heating after pattern formation, despite that such allyl group is stable during the synthesis thereof. It is further featured by the use of a resin capable of introducing the allyl group at a high content without utilizing a compound involving a concern on safety such as allyl alcohol or allyl glycidyl ether, and capable of being synthesized in a step. The present inventors also have found that a composition also excellent in the pigment dispersibility can be obtained while retaining the aforementioned characteristics, by utilizing a copolymer having a specific structural unit in combination with the allyl group.

The possibility of using an allyl group as a reactive group is already described in the JP-B Nos. 50-34444 and 52-48521, JP-A Nos. 59-220731, 1-19572, 2-23351, 5-281734, 7-325400, 8-101505, 10-90510, 2000-292615, 2001-66412 and 2001-66772 mentioned in the foregoing, and there are also disclosed therein examples of application thereof to a color filter or those containing a light-shielding pigment or an inorganic pigment. However, none of these references clearly describes the features of the effect of the allyl group, and a (meth)acryloyl group is merely described as effective as the reactive group in consideration of the polymerizability. A sufficient hardening property cannot be obtained with the resins specifically described in these references.

There is also disclosed an example of the color filter, utilizing a resin having a reactive group, without limitation on the type of the reactive group, for example in JP-A Nos. 6-11831 and 9-269409. However these references indicate a (meth)acryloyl group or the like as specific examples but lack the description on the allyl group. A sufficient hardening property cannot be obtained with the resins specifically described in these references.

There are also known other examples using a resin having an allyl group. JP-B Nos. 3-65542 and 5-2140 disclose a composition including a resin having a carboxyl group and an allyl group, a polymerizable monomer and a diazo resin. However such example is different from the invention because it requires a diazo resin as an essential component and is applied to a printing plate. Also JP-A No. 8-101498 discloses a photosensitive composition in which a pigment is dispersed with a resin having a polymerizable group in the side chain, and describes that an allyl group is effective for improving the sensitivity. However, this example is also limited to an application to a planographic printing plate, and lacks a description that the allyl group is effective in improving the hardness at baking.

Also JP-B No. 62-48819 discloses a negative resist utilizing a resin having both an allyl group and a hydroxyl group in a side chain. It is also described that the etching resistance is improved by baking. However this reference describes that the etching resistance is insufficient with the allyl group alone and lacks the description on the hardness of the obtained image or on the relaxation of the baking conditions. It also lacks the description on the alkali development.

JP-B No. 3-71705 describes a photosensitive resin composition utilizing a resin including dimethylallyl methacrylate as a constituent unit. However this example intends to form a distribution pattern in the refractive index by extraction of specific low molecular weight components, and is therefore different from the invention. Also JP-A No. 5-84894 discloses a composition comprising a resin having an allyl group, and an aromatic aldehyde or an aromatic ketone. However this example intends to form a pattern involving a difference in the refractive index and a relief by eliminating the aromatic aldehyde or aromatic ketone by a reduced pressure process or the like, and is therefore different from the invention.

As described in the foregoing, there has not been known a composition or a transfer material, that can simultaneously satisfy the requirements, such as satisfactory image forming properties including sufficient exposure sensitivity, alkali developability and resolution advantageously applicable to a color filter or a mask material, also that is excellent in the stability with time, hardening property, various resistances after hardening, and pigment dispersibility, and that requires only mild heating conditions for providing such resistances.

SUMMARY OF THE INVENTION

In consideration of the foregoing, the present invention has been conceived to improve the performances of the conventional materials, as a first object thereof. More specifically, the invention intends to provide a photosensitive resin composition which has an exposure sensitivity sufficient for image formation, is developable with a weak alkaline aqueous solution of about pH 10, has a high resolution and various resistances such as hardness, chemical resistance and scratch resistance of the obtained colored image, and is excellent also in the dispersiblity of pigment. It also intends to provide a photosensitive resin composition which can have satisfactory resistances even if the post-heating temperature is lowered in providing such resistances.

Also, the invention secondly intends to provide a transfer material, which is usable in a transfer method and enables preparing a flexible coated article and satisfies the aforementioned characteristics.

Also the invention thirdly intends to provide a method of producing a colored image such as a color filter or a photomask material with such photosensitive resin composition and a color filter and a photomask prepared with such method.

As a result of intensive investigation, the present inventors have found that the above-mentioned objects can be attained by the folloring composition and image forming method, there reaching the invention.

A first aspect of the invention provides a colored photosensitive resin composition for forming a colored image on a transparent substrate, the colored photosensitive resin composition comprising: an alkali-soluble binder, one of a monomer and an oligomer having at least two ethylenic unsaturated double bonds, one of a photopolymerization initiator and a photopolymerization initiating system, and a pigment, said alkali-soluble binder comprising a copolymer including a structural unit having a carboxyl group, a structural unit represented by the following general formula (1), and a structural unit comprising a (meth)acrylate having at least one of an aromatic ring and an alicyclic ring:

General formula (1)

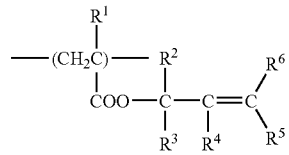

wherein $R^1$ represents one of a hydrogen atom and a methyl group; and each of $R^2$ to $R^6$ independently represents one of a hydrogen atom, a substituted and unsubstituted alkyl group, a substituted and unsubstituted aryl group, a halogen atom and a cyano group.

A second aspect of the invention provides a photosensitive resin transfer material comprising: a temporary support, and a layer including the above-described colored photosensitive resin composition.

A third aspect of the invention provides an image forming method comprising the steps of: forming, on a transparent substrate, at least a layer comprising the above-described colored photosensitive resin composition, and patternwise exposing and alkali developing.

A fourth aspect of the invention provides a method for producing a color filter comprising the steps of: performing the image forming method described above repeatedly, utilizing a plurality of layers including said colored photosensitive resin compositions of different colors.

A fifth aspect of the invention provides a method for producing a photomask comprising the steps of: forming, on a transparent substrate, a layer comprising the above-described photosensitive resin composition including a pigment having absorption in the ultraviolet region, exposing the layer comprising said photosensitive resin composition to near ultraviolet or visible light, and developing the layer comprising the photosensitive resin composition to form an image.

A sixth aspect of the invention provides a color filter prepared by forming, on a transparent substrate, a layer comprising the above-described colored photosensitive resin composition for each of multiple colors, and patternwise exposing the resultant layer and developing the layer with an alkaline solution to form a multi-colored image.

A seventh aspect of the invention provides a photomask prepared by forming, on a transparent substrate, a layer of the above-described photosensitive resin composition including a pigment having an absorption in the ultraviolet region, exposing said layer of the photosensitive resin composition to one of near ultraviolet and visible light and developing the layer of the photosensitive resin composition to form an image.

DETAILED DESCRIPTION OF THE PREFERRED EMBODIMENTS

Figure 1:
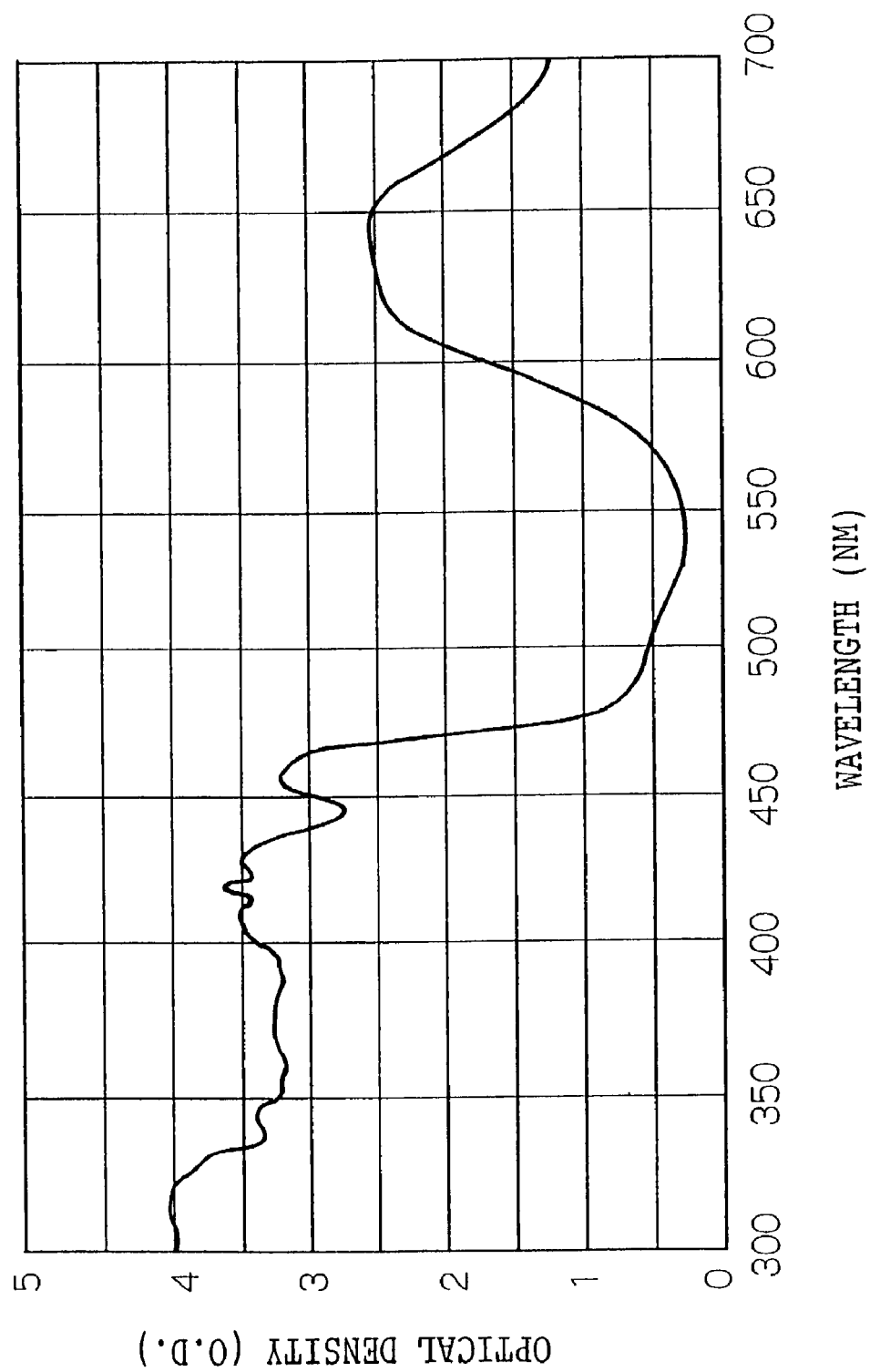
FIG. 1 is a chart showing the absorption spectrum of a photomask material of the invention.

The colored photosensitive resin composition of the present invention includes an alkali-soluble binder, a monomer or an oligomer having at least two ethylenic unsaturated double bonds, a photopolymerization initiator or initiating system, and a pigment, and adapted for forming a colored image on a transparent substrate, wherein the aforementioned alkali-soluble binder includes a copolymer including a structural unit having a carboxyl group, a structural unit represented by the above-described general formula (1), and a structural unit comprising a (meth)acrylate having at least an aromatic ring and/or an aliphatic ring.

Hereinafter, an explanation will be made on the invention in detail.

Alkali-Soluble Binder

The copolymer of the invention, constituting a principal component of the aforementioned alkali-soluble binder, is a copolymer including a structural unit having a carboxyl group, a structural unit represented by the following general formula (1), and a structural unit comprising a (meth)acrylate having at least an aromatic ring and/or an aliphatic ring:

General formula (1)

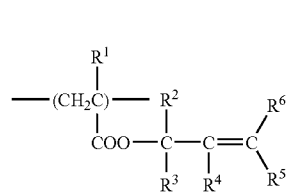

Such copolymer can be obtained for example by copolymerizing, in a known method, a polymerizable monomer having a carboxyl group, a monomer represented by the following general formula (2), a (meth)acrylate having at least an aromatic ring and/or an aliphatic ring, and, if necessary, another monomer which can copolymerize with the foregoing components:

General formula (2)

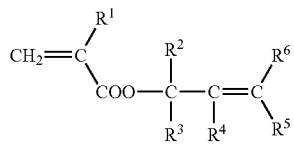

wherein $R^1$ represents a hydrogen atom or a methyl group; and each of $R^2$ to $R^6$ independently represents a hydrogen atom, an alkyl or aryl group that may be substituted, a halogen atom or a cyano group.

Examples of the aforementioned polymerizable monomer having a carboxyl group include (meth)acrylic acid, vinylbenzoic acid, maleic acid, itaconic acid, crotonic acid, sinnamic acid and acrylic acid dimer. There can also be used an addition product of a monomer having a hydroxyl group such as 2-hydroxyethyl(meth)acrylate with a cyclic anhydride such as maleic anhydride or phthalic anhydride. There can also be used an anhydride monomer such as maleic anhydride or itaconic anhydride as the precursor of carboxylic acid. Among these, (meth)acrylic acid is particularly preferable in consideration of polymerizability and raw material cost.

Examples of the monomer represented by the aforementioned formula (2) include allyl(meth)acrylate, 3-chloro-2-propenyl(meth)acrylate, 3-phenyl-2-propenyl(meth)acrylate, 3-(hydroxyphenyl)-2-propenyl(meth)acrylate, 3-(2-hydroxyphenyl)-2-propenyl(meth)acrylate, 3-(3,4-dihydroxyphenyl)-2-propenyl(meth)acrylate, 3-(2,4-dihydroxyphenyl)-2-propenyl(meth)acrylate, 3-(3,4,5-trihydroxyphenyl)-2-propenyl(meth)acrylate, 3-(3-methoxy-4-hydroxyphenyl)-2-propenyl(meth)acrylate, 3-(3,4-dihydroxy-5-methoxyphenyl)-2-propenyl(meth)acrylate, 3-(3,5-dimethoxy-4-hydroxyphenyl)-2-propenyl(meth)acrylate, 3-(2-hydroxy-4-methylphenyl)-2-propenyl(meth)acrylate, 3-(4-methoxyphenyl)-2-propenyl(meth)acrylate, 3-(4-ethoxyphenyl)- 2-propenyl(meth)acrylate, 3-(2-methoxyphenyl)-2-propenyl(meth)acrylate, 3-(3,4-dimethoxyphenyl)-2-propenyl(meth)acrylate, 3-(3-methoxy-4-propoxyphenyl)-2-propenyl(meth)acrylate, 3-(2,4,6-trimethoxyphenyl)-2-propenyl(meth)acrylate, 3-(3-methoxy-4-benzyloxyphenyl)-2-propenyl(meth)acrylate, 3-(3-(3'-methoxyphenyl)-4-benzyloxyphenyl)-2-propenyl (meth)acrylate, 3-(3,4,5-trimethoxyphenyl)-2-propenyl (meth)acrylate, 3-(4-methylphenyl)-2-propenyl(meth)acrylate; 3-phenyl-3-(2,4,6-trimethylphenyl)-2-propenyl(meth)acrylate, 3,3-[di-(2,4,6-trimethylphenyl)]-2-propenyl(meth)acrylate, 3-phenyl-3-(4-methylphenyl)-2-propenyl(meth)acrylate, 3,3-diphenyl-2-propenyl(meth)acrylate, 3-(2-chlorophenyl)-2-propenyl(meth)acrylate, 3-(3-chlorophenyl)-2-propenyl(meth)acrylate, 3-(4-chlorophenyl)-2-propenyl(meth)acrylate, 3-(2,4-dichlorophenyl)-2-propenyl(meth)acrylate, 3-(2-bromophenyl)-2-propenyl(meth)acrylate, 3-bromo-3-phenyl-2-propenyl(meth)acrylate, 3-chloro-3-phenyl-2-propenyl(meth)acrylate, 3-(4-nitro-phenyl)-2-propenyl (meth)acrylate, 3-(2-nitro-phenyl)-2-propenyl(meth)acrylate, 3-(3-nitro-phenyl)-2-propenyl(meth)acrylate, 2-methyl-3-phenyl-2-propenyl(meth)acrylate, 2-methyl-3-(4-chlorophenyl)-2-propenyl(meth)acrylate, 2-methyl-3-(4-nitrophenyl)-2-propenyl(meth)acrylate, 2-methyl-3-(4-aminophenyl)-2-propenyl(meth)acrylate, 2-methyl- 3,3-diphenyl-2-propenyl(meth)acrylate, 2-ethyl-1,3-diphenyl-2-propenyl(meth)acrylate, 2-ethoxymethylene-3-phenyl-2- propenyl(meth)acrylate, 2-methyl-3-(4-methoxyphenyl)-2-propenyl(meth)acrylate, 2,3-diphenyl-2-propenyl(meth)acrylate, 1,2,3-triphenyl-2-propenyl(meth)acrylate, 2,3,3-triphenyl-2-propenyl(meth)acrylate, 1,3-diphenyl-2-propenyl(meth)acrylate, 1-(4-methylphenyl)-3-phenyl-2-propenyl(meth)acrylate, 1-phenyl-3-(4-methylphenyl)-2-propenyl(meth)acrylate, 1-phenyl-3-(4-methoxyphenyl)-2-propenyl(meth)acrylate, 1-(4-methoxyphenyl)-3-phenyl-2-propenyl(meth)acrylate, 1,3-di(4-chlorophenyl)-2-propenyl(meth)acrylate, 1-(4-bromophenyl)-3-phenyl-2-propenyl(meth)acrylate; 1-phenyl-3-(4-nitrophenyl)-2-propenyl(meth)acrylate, 1,3-di(2-nitrophenyl)-2-propenyl(meth)acrylate, 1-(4-dimethylaminophenyl)-3-phenyl-2-propenyl(meth)acrylate, 1-phenyl-3-(4-dimethylaminophenyl)-2-propenyl(meth)acrylate, 1,1-di(4-dimethylaminophenyl)-3-phenyl-2-propenyl(meth)acrylate, 1,1,3-triphenyl-2-propenyl(meth)acrylate, 1,1,3,3-tetraphenyl-2-propenyl(meth)acrylate, 1-(4-methylphenyl)-3-phenyl-2-propenyl(meth)acrylate, 1-phenyl-2-propenyl(meth)acrylate, 1,2-diphenyl-2-propenyl(meth)acrylate, 1-phenyl-2-methyl-2-propenyl(meth)acrylate, 1-cyclohexyl-2-propenyl(meth)acrylate, 2-benzyl-2-propenyl(meth)acrylate, 1,1-di(4-chlorophenyl)-2-propenyl(meth)acrylate, 1-cyano-2-propenyl(meth)acrylate, 3-anilino-2-propenyl(meth)acrylate, 3-(2-methylphenyl)-2-propenyl(meth)acrylate, 3-(2,4-dimethylphenyl)-2-propenyl(meth)acrylate, 1-(2-carbetoxyisopropyl)-3-methyl-2-propenyl(meth)acrylate, 1-(1-carbetoxyisopropyl)-2-propenyl(meth)acrylate, 1-(1-carbetoxyethyl)-3-methyl-2-propenyl(meth)acrylate, 1-carbetoxy-3-chloro-3-methyl-2-propenyl(meth)acrylate, 1-carbetoxymethylene-3-methyl-2-propenyl(meth)acrylate, 1-cyano-3-methyl-2-propenyl(meth)acrylate, 1-cyclohexyl-3-(2-hydroxycyclohexyl)-2-propenyl(meth)acrylate, 3-cyclopentyl-2-propenyl(meth)acrylate; 3-furyl-2-propenyl(meth)acrylate, 3-chloro-2-propenyl(meth)acrylate, 3-bromo-2-propenyl(meth)acrylate, 2-methyl-3-chloro-2-propenyl(meth)acrylate, 2-methyl-3-bromo-2-propenyl(meth)acrylate, 2-chloro-3-phenyl-2-propenyl(meth)acrylate, 2-bromo-3-phenyl-2-propenyl(meth)acrylate, 2-bromo-3-(4-nitrophenyl)-2-propenyl(meth)acrylate, 2-fluoro-3-phenyl-2-propenyl(meth)acrylate, 2-fluoro-3-(4-methoxyphenyl)-2-propenyl(meth)acrylate, 2-cyano-3-phenyl-2-propenyl(meth)acrylate, 2-chloro-2-propenyl(meth)acrylate, 2-bromo-2-propenyl(meth)acrylate, 2-chloro-3,3-difluoro-2-propenyl(meth)acrylate, 2-fluoro-3-chloro-2-propenyl(meth)acrylate, 2,3-dibromo-2-propenyl(meth)acrylate, 2-chloro-3-methyl-2-propenyl(meth)acrylate, 1,1-dimethyl-2-propenyl(meth)acrylate, 2-pentenyl(meth)acrylate, 2-hexenyl(meth)acrylate, and 2-heptenyl(meth)acrylate. Among these, allyl(meth)acrylate is particularly preferable in consideration of hardening ability and raw material cost.

Examples of the aforementioned (meth)acrylate having at least an aromatic ring and/or an aliphatic ring include cycloalkyl(meth)acrylates [such as cyclohexyl(meth)acrylate, norbornyl(meth)acrylate, or adamantyl(meth)acrylate], aryl(meth)acrylates [such as phenyl(meth)acrylate, chlorophenyl(meth)acrylate, methoxyphenyl(meth)acrylate, or naphthyl(meth)acrylate] and aralkyl(meth)acrylates [such as benzyl(meth)acrylate, or phenethyl(meth)acrylate]. Among these, (meth)acrylate and cyclohenyl(meth)acrylate are preferable in consideration of raw material cost, solubility and pigment dispersibility.

Also examples of another monomer which can copolymerize with these structural units include alkyl(meth)acrylates [for example ($C_1$ to $C_{18}$) alkyl esters of (meth)acrylic acid such as methyl(meth)acrylate, ethyl(meth)acrylate, propyl(meth)acrylate, isopropyl(meth)acrylate, n-butyl(meth)acrylate, isobutyl(meth)acrylate, t-butyl(meth)acrylate, hexyl(meth)acrylate, octyl(meth)acrylate, 2-ethylhexyl(meth)acrylate, lauryl(meth)acrylate or stearyl(meth)acrylate]; aralkyl(meth)acrylates [such as benzyl(meth)acrylate], substituted alkyl(meth)acrylates [such as dimethylaminoethyl(meth)acrylate, diethylaminoethyl(meth)acrylate, dimethylaminopropyl(meth)acrylate or diethylaminopropyl(meth)acrylate], (meth)acrylamides [such as (meth)acrylamide, dimethyl(meth)acrylamide, isopropyl (meth)acrylamide, or t-butyl(meth)acrylamide], substituted (meth)acrylamides [such as (meth)acryloyl morpholine or dimethylaminopropyl(meth)acrylamide], aromatic vinyl compounds [such as styrene, vinyltoluene or α-methylstyrene], heterocyclic vinyl compounds [such as vinylimidazol or vinylpyridine], vinyl esters [such as vinyl acetate, vinyl propionate or vinyl barsatate], N-vinylamides [such as N-vinylpyrrolidone, N-vinylformamide or N-vinylacetoamide], allyl esters [such as allyl acetate], halogen-containing monomers [such as vinylidene chloride or vinyl chloride], vinyl cyanides [such as (meth)acrylonitrile], and olefins [such as ethylene or propylene].

Among these, alkyl(meth)acrylates [such as methyl(meth)acrylate, ethyl(meth)acrylate, propyl(meth)acrylate, isopropyl(meth)acrylate, n-butyl(meth)acrylate, isobutyl(meth)acrylate, t-butyl(meth)acrylate, hexyl(meth)acrylate, octyl(meth)acrylate, or 2-ethylhexyl(meth)acrylate are particularly preferable in consideration of the copolymerizing property, the solubility of the resulting polymer in solvents and the film forming property of the obtained polymer.

Such another copolymerizable component may be used alone or in a combination of two or more kinds.

As regards the copolymerization composition ratio of these components, the structural unit having carboxyl group is preferably present within a range of 10 to 40 mol %, more preferably 15 to 35 mol % and most preferably 20 to 35 mol %. An amount of the unit having carboxyl group less than 10 mol % may result in a deficiency in the developability, and an amount exceeding 40 mol % may deteriorate the resistance of the image portion to the developing solution. Also the structural unit represented by the general formula (1) is preferably present within a range of 20 to 80 mol %, more preferably 20 to 75 mol %, and most preferably 25 to 75 mol %. An amount of the unit represented by the general formula (1) less than 20 mol % may result in a deficiency in the hardening property, and an amount exceeding 80 mol % may result in a deficiency in the developability. Also the structural unit comprising a (meth)acrylate having at least an aromatic ring and/or aliphatic ring is preferably present within a range of 10 to 70 mol %, more preferably 10 to 60 mol % and most preferably 10 to 50 mol %. An amount of the unit comprising a (meth)acrylate having at least an aromatic ring and/or aliphatic ring less than 10 mol % may deteriorate the pigment dispersibility, and an amount exceeding 70 mol % may result in a deficiency in the developability and the hardening property.

Also the copolymer used in the invention preferably has a weight-average molecular weight of 5,000 to 200,000, more preferably 10,000 to 100,000 and most preferably 12,000 to 80,000. The copolymer whose weight-average molecular weight is less than 5,000 may not be producible, while the copolymer whose molecular weight exceeds 200,000 may result in a deficiency in the developability.

Specific examples used in the copolymer of the invention are shown as follows, but the invention is not limited by such example compounds.

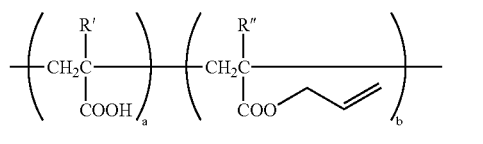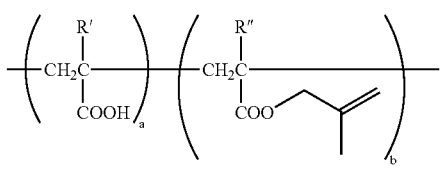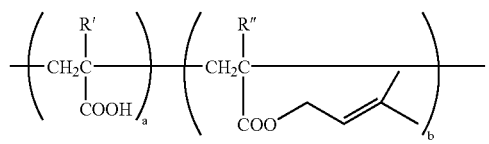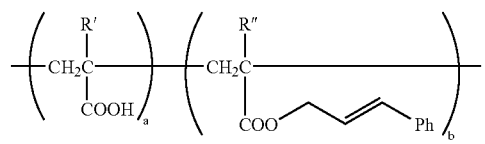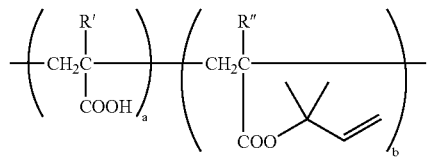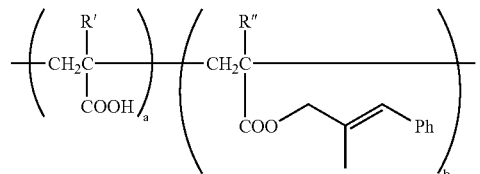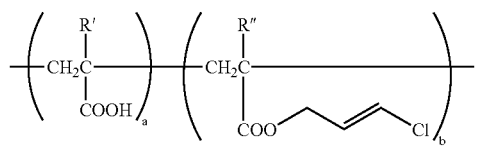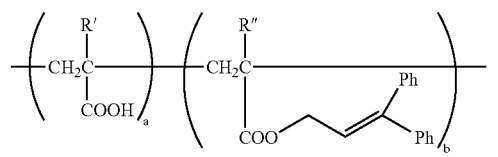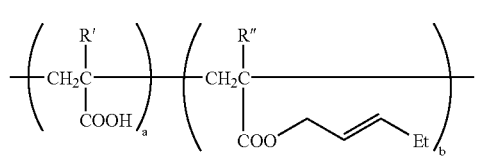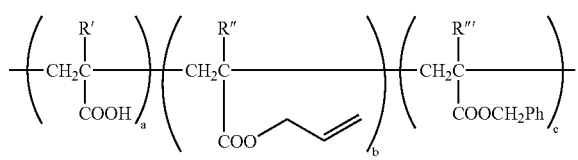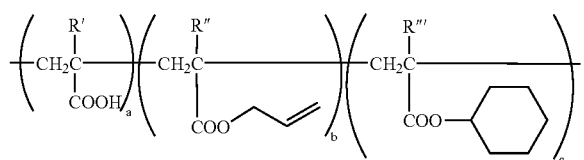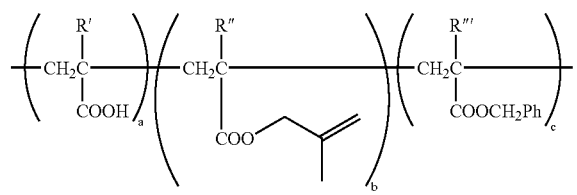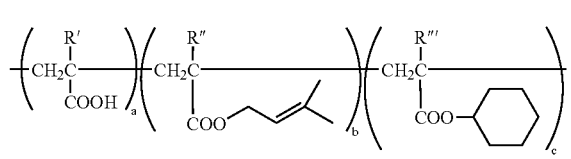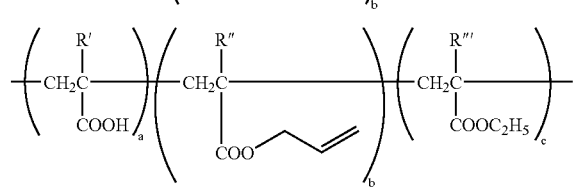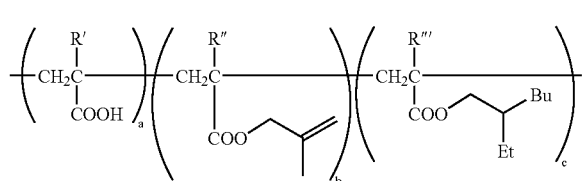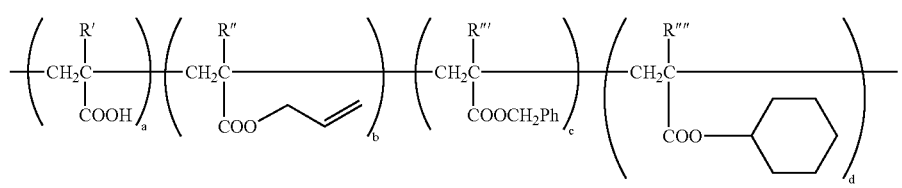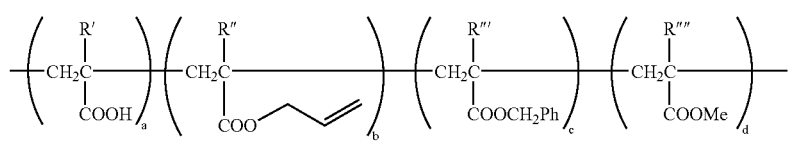

Such copolymer can be obtained by copolymerizing the respectively corresponding monomers by an ordinary known method. For example it can be obtained by dissolving these monomers in a suitable solvent, adding a radical polymerization initiator and carrying out a polymerization reaction in liquid.

The suitable solvent for the above-mentioned copolymerization can be arbitrarily selected according to the monomers to be used and the solubility of the resulting copolymer, and can be, for example, methanol, ethanol, propanol, isopropanol, 1-methoxy-2-propanol, acetone, methyl ethyl ketone, methyl isobutyl ketone, methoxypropyl acetate, ethyl lactate, ethyl acetate, acetonitrile, tetrahydrofuran, dimethylformamide, chloroform, toluene or a mixture thereof.

Also the polymerization initiator can be an azo compound such as 2,2'-azobis(isobutyronitrile) (AIBN) or 2,2'-azobis-(2,4'-dimethylvaleronitrile), a peroxide such as benzoyl peroxide or a persulfate salt.

Also a known chain transfer agent may be suitably used in order to adjust the molecular weight. Also in order to suppress the reaction of the allyl group in the polymerizaiton, it is necessary to suitably adjust the polymerization concentration, the amount of the initiator, the chain transfer agent and the polymerization temperature. For example, the polymerization concentration is preferably 5 to 50 mass %, and more preferably 10 to 40 mass %.

As the alkali-soluble binder, in addition to the aforementioned copolymer, there may also be used in combination a known alkali-soluble binder not including a reactive unsaturated double bond in the side chain, within an extent not deteriorating the characteristics intended in the invention.

Such polymer not including a reactive unsaturated double bond in the side chain is commonly used in alkali-developable photopolymer systems, and can be, for example, a copolymer of at least one of the aforementioned polymerizable monomers having a carboxyl group and at least a monomer selected from (meth)acrylic acid esters, (meth) acrylamides, aromatic vinyl compounds, heterocyclic vinyl compounds and vinyl esters.

Examples of such polymer include (meth)acrylic acid/ benzyl(meth)acrylate copolymer and (meth)acrylic acid/methyl(meth)acrylate/benzyl(meth)acrylate/2-ethylhexyl (meth)acrylate copolymer.

Monomer/Oligomer Having at Least Two Double Bonds

In the following, a monomer/oligomer having at least two ethylenic unsaturated double bonds will be explained.

The monomer or oligomer having at least two ethylenic unsaturated double bonds retains the solubility of the aforementioned copolymer in an aqueous alkali solution, but polymerizes upon receiving a radiation, thereby reducing the solubility of the copolymer and a coated film in the aqueous alkali solution.

It has a structure, for example, of a monomer, a prepolymer such as a dimer or a trimer, an oligomer or a mixture thereof or a copolymer thereof. Examples of such monomer and copolymer thereof include esters of an unsaturated carboxylic acid (such as acrylic acid, methacrylic acid, itaconic acid, crotonic acid, isocrotonic acid or maleic acid) and an aliphatic polyhydric alcohol, and amides of an unsaturated carboxylic acid and an aliphatic polyvalent amine.

Examples of the monomer comprising an ester of an aliphatic polyhydric alcohol and an unsaturated carboxylic acid include, within the acrylic acid esters, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri (acryloyloxyethyl)isocyanurate and polyester acrylate oligomer.

Examples of the methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glyol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of the itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of the crotonic acid esters include ethylene glycol dicrotonate, tetramethylene glycol dicrotonate, pentaerythritol dicrotonate and sorbitol tetradicrotonate. Also examples of the isocrotonic acid esters include ethylene glycol diisocrotonate, pentaerythritol diisocrotonate and sorbitol tetraisocrotonate.

Examples of the maleic acid esters include ethylene glycol dimaleate, triethylene glycol dimaleate, pentaerythritol dimaleate and sorbitol tetramaleate. Also there can be used a mixture of the aforementioned ester monomers.

Also, examples of the monomer comprising the amide of an aliphatic polyvalent amine and an unsaturated carboxylic acid include methylene-bis-acrylamide, methylene-bis-methacrylamide, 1,6-hexamethylene-bis-acrylamide, 1,6-hexamethylene-bis-methacrylamide, diethylene-triamine-trisacrylamide, xylylene-bis-acrylamide and xylylene-bis-methacrylamide.

Other examples include a vinylurethane compound, containing two or more polymerizable vinyl groups in a molecule, formed by adding a hydroxyl group-containing vinyl monomer represented by the following general formula (5) to a polyisocyanate compound having two or more isocyanate groups in a molecule and described in the JP-B No. 48-41708:

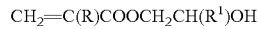

CH$_2$=C(R)COOCH$_2$CH(R$^1$)OH           General Formula (5)

wherein each of R and R$^1$ represents a hydrogen atom or CH$_3$.

There can also be employed polyfunctional acrylates and methacrylates such as urethane acrylates described in JP-A No. 51-37193, polyester acrylates described in JP-A No. 48-64183 and JP-B Nos. 49-43191 and 52-30490, and epoxy acrylates obtained by reacting an epoxy resin and (meth) acrylic acid. Also employable are photosettable monomers and oligomers introduced in the Bulletin of Japanese Adhesion Organization, vol. 20, No. 7, pp300–308 (1984). These compounds which have at least an ethylenic unsaturated bond and can addition-polymerize can be used alone or in a combination of two or more kinds. Its amount with respect to the total solid of the composition is 5 to 70 mass %, preferably 10 to 60 mass % and particularly preferably 30 to 50 mass %. An amount less than 5 mass % may deteriorate the property (for example solvent resistance) of the obtained insulating image, and, when the amount thereof exceeds 70 mass %, the coated film of the photosensitive composition may become excessively soft to deteriorate the handling property.

Photopolymerization Initiator, Photopolymerization Initiating System

In the following, an explanation will be given on the photopolymerization initiator and the photopolymerization initiating system (a combination of photopolymerization initiators, a combination of a photopolymerization initiator and a sensitizer and the like).

The photopolymerization initiator is a compound which can substantially cause photopolymerization of a copolymer of the aforementioned monomer or oligomer having at least two ethylenic unsaturated double bonds, the aforementioned structural unit having at least a carboxylic group, and the structural unit represented by the general formula (1). Any compound causing the polymerization of the above-mentioned ethylenic unsaturated bond can be used as such photopolymerization initiator, and a compound having sensitivity to the light of ultraviolet region can be preferably used.

Also the photopolymerization initiator used in the invention can be an activator which generates an active radical by any interaction with a photo-excited sensitizer. Examples of the photopolymerization initiator that can be advantageously employed in the invention include halogenated hydrocarbons having a triazine skeleton, halogenated hydrocarbons having an oxadiazole skeleton, phenylacrydine derivatives, ketones, ketoximes, organic peroxides, thio compounds, hexaarylbiimidazole, aromatic onium salts, ketoxime ethers and titanocene compounds.

Examples of the halogenated hydrocarbons having a triazine skeleton include those described by Wakabayashi et al., Bull. Chem. Soc. Japan, 42, 2924 (1969), such as 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2',4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine.

Also usable are those described in the British Patent No. 1388492, such as 2-styryl-4,6-bis-(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methoxystyryl)-4-amino-6-trichloromethyl-s-triazine; those described in JP-A No. 53-133428 such as 2-(4-methoxynaphtho-1-yl)-4,6-bis-trichloromethyl-s-triazine, 2-(4-ethoxynaphtho-1-yl)-4,6-bis(trichloromethyl)-s-triazine, 2-[4-(2-ethoxyethyl)-naphtho-1-yl]-4,6-bis(trichloromethyl)-s-triazine, 2-(4,7-dimethoxynaphtho-1-yl)-4,6-bis-trichloromethyl-s-triazine, and 2-(acenaphtho-5-yl)-4,6-bis(trichloromethyl)-s-triazine; and those described in German Patent No. 3337024 such as 2-(4-styrylphenyl)-4,6-bis (trichloromethyl)-s-triazine, 2-(4-p-methoxystyrylphenyl)-4,6-bis-(trichloromethyl)-s-triazine, 2-(1-naphthylvinylenephenyl)-4,6-bis-(trichloromethyl)-s-triazine, 2-chlorostyrylphenyl-4,6-bis(trichloromethyl)-s-triazine, 2-(4-thiophene-2-vinylenephenyl)-4,6-bis(trichloromethyl)-s-triazine, 2-(4-thiophene-3-vinylenephenyl)-4,6-bis-(trichloromethyl)-s-triazine, 2-(4-furan-2-vinylenephenyl)-4,6-bis(trichloromethyl)-s-triazine, and 2-(4-benzofuran-2-vinylenephenyl)-4,6-bis(trichloro-methyl)-s-triazine.

Compounds described by F. C. Schaeferetal., J. Org. Chem., 29, 1527 (1964), such as 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine can be also used.

Compounds described in JP-A No. 62-58241, such as 2-(4-phenylacetylenephenyl)-4,6-bis(trichloromethyl)-s-triazine, 2-(4-naphthyl-1-acetylenephenyl)-4,6-bis(trichloromethyl)-s-triazine, 2-(4-p-tolylacetylenephenyl)-4,6-bis(trichloromethyl)-s-triazine, 2-(4-p-methoxyphenylacetylenephenyl)-4,6-bis(trichloromethyl)-s-triazine, 2-(4-p-isopropylphenylacetylenephenyl)-4,6-bis(trichloromethyl)-s-triazine, and 2-(4-p-ethylphenylacetylenephenyl)-4,6-bis(trichloromethyl)-s-triazine can be also used.

In addition, compounds described in JP-A No. 5-281728, such as 2-(4-trifluoromethylphenyl)-4,6-bis(trichloromethyl)-s-triazine, 2-(2,6-difluorophenyl)-4,6-bis(trichloromethyl)-s-triazine, 2-(2,6-dichlorophenyl)-4,6-bis(trichloromethyl)-s-triazine, and 2-(2,6-dibromophenyl)-4,6-bis(trichloromethyl)-s-triazine, and 2,4-bis(trichloromethyl)-6-[4-(N,N-diethoxycarbonylmethylamino)-3-bromophenyl]-s-triazine described in JP-A No, 5-34920 can be used.

Also examples of the halogenated hydrocarbons having an oxadiazole skeleton include those described for example in JP-A No. 2000-39712, more specifically those indicated in the following:

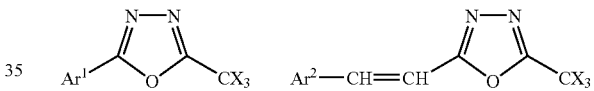

wherein each of $Ar_1$ and $Ar_2$ represents an aromatic ring that may have a substituent, and X represents a halogen atom.

Examples of ketoxime compounds advantageously employable in the invention are indicated by the following general formula (6):

General Formula (6)

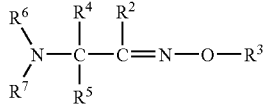

wherein $R^2$ and $R^3$, which may be same or different, each represents a hydrocarbon group that may have a substituent or an unsaturated bond, or a heterocyclic group; $R^4$ and $R^5$ which may be same or different, each represents a hydrogen atom, a hydrocarbon group that may have a substituent or an unsaturated bond, a heterocyclic group, a hydroxyl group, a substituted oxy group, a mercapto group, or a substituted thio group. $R^4$ and $R^5$ can bond to each other to form a ring and such a ring represents an alkylene group of 2 to 8 carbon atoms that may include —O—, —$NR^6$—, —O—CO—, —NH—CO—, —S— and/or —$SO_2$— in the connecting main chain of the ring. Each of $R^6$ and $R^7$ represents a hydrogen atom, a hydrocarbon group which may include a substituent or an unsaturated bond, or a substituted carbonyl group.

Examples of such compounds include, but are not limited to, p-methoxyphenyl 2-N,N-dimethylaminopropyl ketoneoxime-O-allyl ether, p-methylthiophenyl 2-morpholinopropyl ketoneoxime-O-allyl ether, p-methylthiophenyl 2-morpholinopropyl ketoneoxime-O-benzyl ether, p-methylthiophenyl 2-morpholinopropyl ketoneoxime-O-n-butyl ether, p-morpholinophenyl 2-morpholinopropyl ketoneoxime-O-allyl ether, p-methoxyphenyl 2-morpholinopropyl ketoneoxime-O-n-dodecyl ether, p-methylthiophenyl 2-morpholinopropyl ketoneoxime-O-methoxyethoxyethyl ether, p-methylthiophenyl 2-morpholinopropyl ketoneoxime-O-p-methoxycarbonylbenzyl ether, p-methylthiophenyl 2-morpholinopropyl ketoneoxime-O-methoxycarbonylmethyl ether, p-methylthiophenyl 2-morpholinopropyl ketoneoxime-O-ethoxycarbonylmethyl ether, p-methylthiophenyl 2-morpholinopropyl ketoneoxime-O-4-butoxycarbonylbutyl ether, p-methylthiophenyl 2-morpholinopropyl ketoneoxime-O-2-ethoxycarbonylethyl ether, p-methylthiophenyl 2-morpholinopropyl ketoneoxime-O-methoxycarbonyl-3-propenyl ether and p-methylthiophenyl 2-morpholinopropyl ketoneoxime-O-benzyloxycarbonylmethyl ether.

Examples of hexaarylbiimidazole used in the invention include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenylbiimidazole. These biimidazoles can be easily synthesized for example by methods disclosed in Bull. Chem. Soc. Japan, 33, 565 (1960) and J. Org. Chem., 36 (16), 2262 (1971).

Examples of ketoxime esters include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one, and 2-ethoxycarbonyloxyimino-1-phenylpropan-1-one.

There can also be used titanocene initiators. As examples of such compound, any titanocene compound that can generate an active radical under the light irradiation in the presence of a sensitizing dye can be suitably selected from known compounds described for example in JP-A Nos. 59-152396 and 60-151197. More specific examples include di-cyclopentadienyl-Ti-dichloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-difluorophen-1-yl, di-cyclopentadienyl-Ti-bis-2,4-difluorophen-1-yl, di-methylcyclopentadienyl-Ti-bis-2,3,4,5,6-pentafluorophen-1-yl, di-methylcyclopentadienyl-Ti-bis-2,3,5,6-tetrafluorophen-1-yl, di-methylcyclopentadienyl-Ti-bis-2,4-difluorophen-1-yl, and bis(cyclopentadienyl)-bis(2,6-difluoro-3-(pyr-1-yl)phenyl) titanium.

The photopolymerization initiator or photopolymerization initiating system, in the case of using a pigment having absorption in the ultraviolet region, is preferably a photopolymerization initiating system comprising a combination of a sensitizing dye which can absorb a laser beam and a polymerization initiator, since a laser plotter used in the image formation for the photomask material or the like has a laser wavelength within the visible region. Such example is described for example in JP-A No. 2000-39712.

Specific examples of such compound are shown as follows:

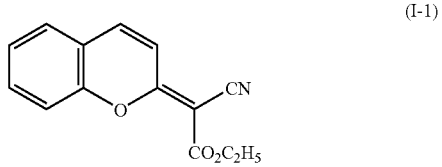
(I-1)

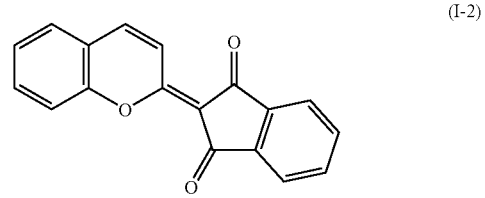
(I-2)

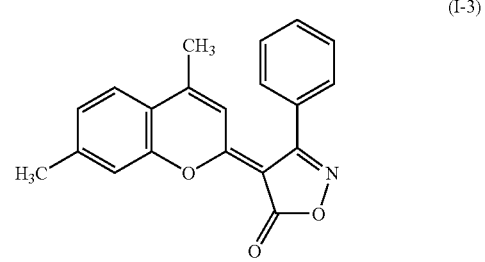
(I-3)

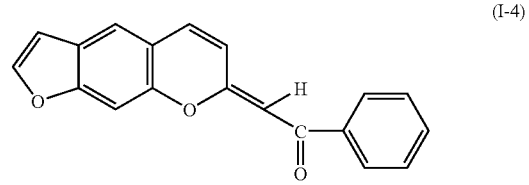
(I-4)

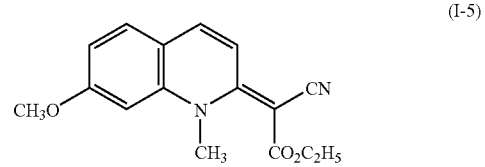
(I-5)

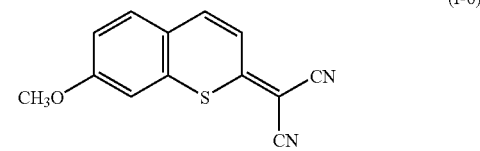
(I-6)

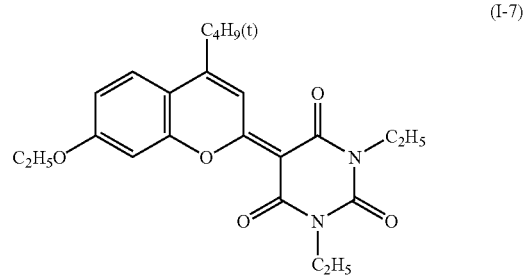
(I-7)

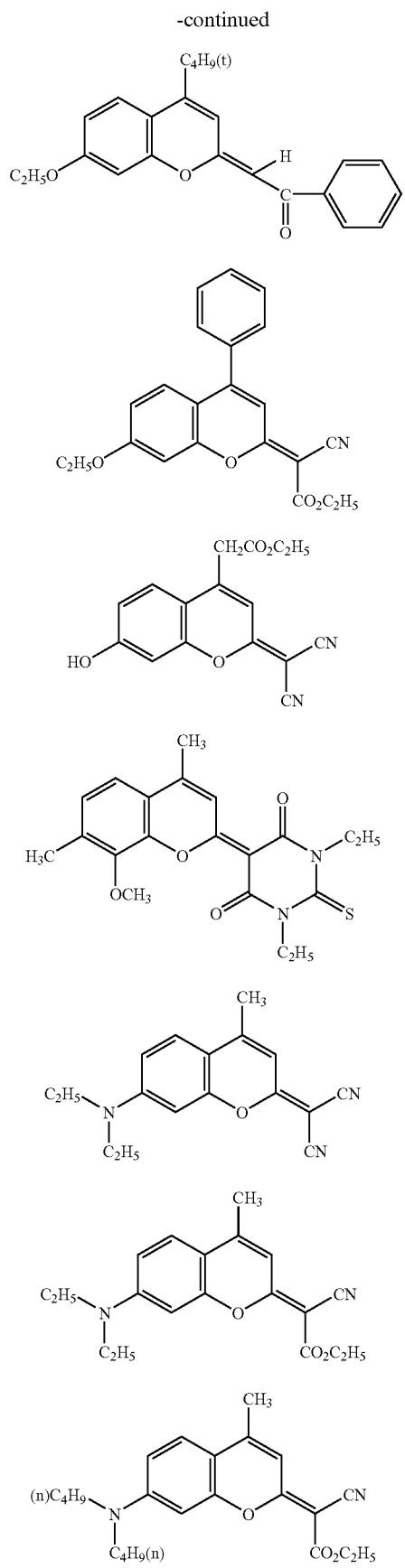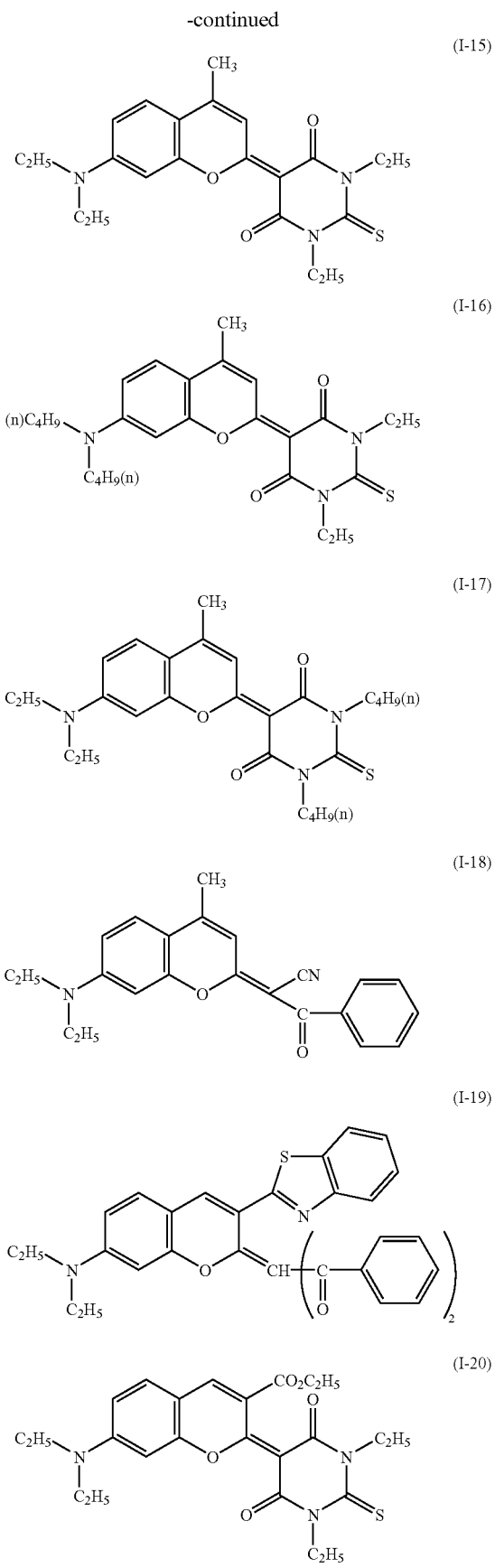

(I-21)
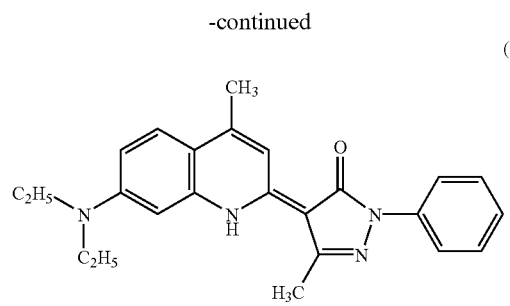
(I-22)
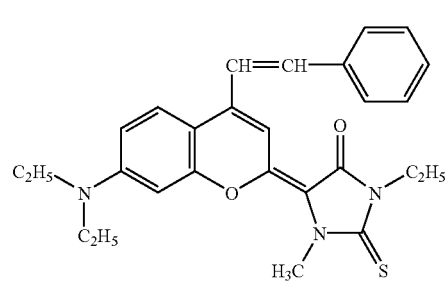
(I-23)
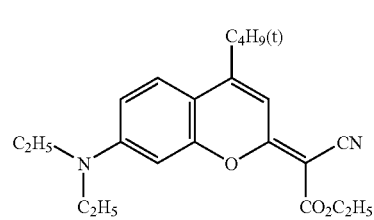
(I-24)
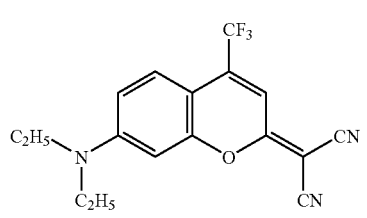
(I-25)
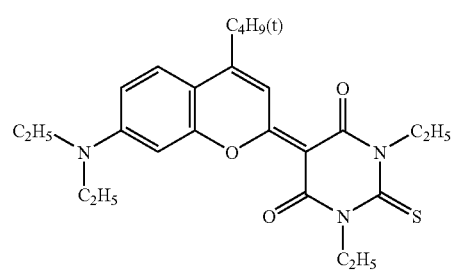
(I-26)
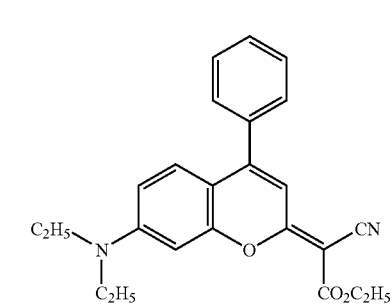
(I-27)
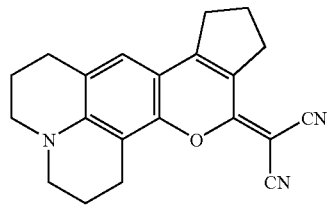
(I-28)
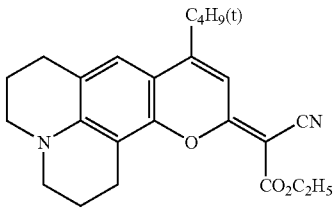
(I-29)
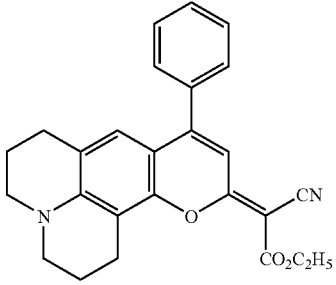
(I-30)
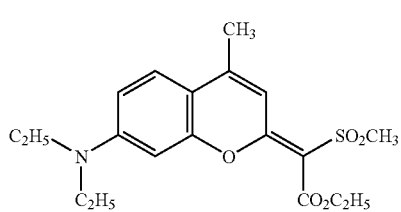
(I-31)
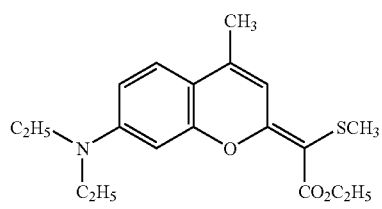
(I-32)
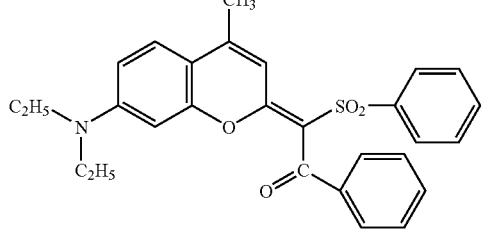

-continued

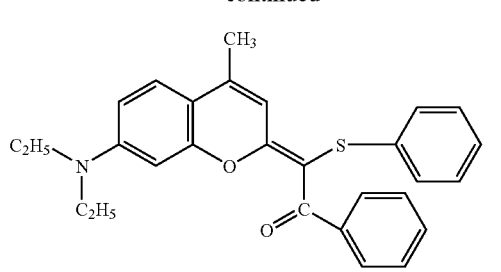
(I-33)

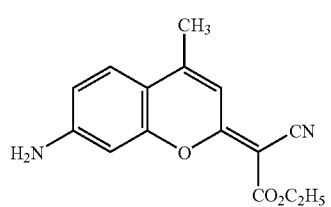
(I-34)

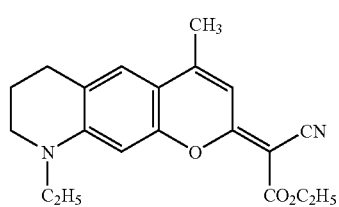
(I-35)

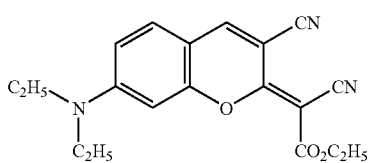
(I-36)

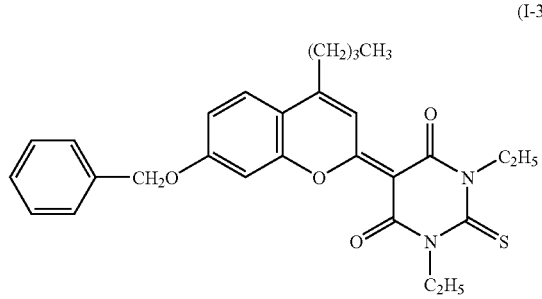
(I-37)

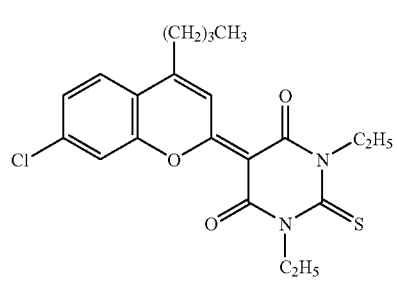
(I-38)

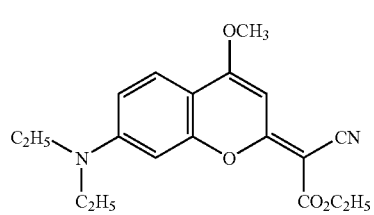
(I-39)

Among these, systems utilizing a halogenated hydrocarbon having a triazine skeleton, a halogenated hydrocarbon having an oxadiazole skeleton, hexaarylbiimidazole or a titanocene compound are particularly preferable because of satisfactory sensitivity, storability and adhesion of the coated film to the substrate.

These photopolymerization initiators may be used alone or in a combination of two or more kinds. It is also possible to use several compounds of different kinds in combination. The amount of such photopolymerization initiator with respect to the total solid of the composition is 0.1 to 50 mass %, and preferably 0.5 to 30 mass %. An amount less than 0.1 mass % may result in a low photosensitivity which cannot achieve image formation within a practical time, and an amount exceeding 50 mass % not only hinders compatibility of the composition but also may deteriorate characteristics (such as chemical resistance) of the obtained image as an insulating film.

Pigment

As the pigment, there can be employed an organic pigment or an inorganic pigment, but an organic pigment is preferable in consideration of the hue thereof and the resistance of image.

Examples of the pigment include C. I. PR254, C. I. PR177, C. I. PR224, C. I. PG36, C. I. PB15:6, C. I. PB60, C. I. PG7, C. I. PY138, C. I. PY139, C. I. PY150, C. I. PY128, and C. I. PY185.

The content of the pigment (coloring agent) in the colored photosensitive resin composition is preferably 3 to 60 mass %, and more preferably 5 to 50 mass %.

In the invention, the suitable pigment is desirably used as a dispersion. Such dispersion can be prepared by the following methods:

(1) a method of dispersing a composition, obtained by mixing the aforementioned pigment and a pigment dispersant in advance, in an organic solvent (or a vehicle);

(2) a method separately adding and dispersing the aforementioned pigment and the pigment dispersant in an organic solvent (or a vehicle);

(3) a method of separately dispersing in advance the aforementioned pigment and the pigment dispersant in organic solvent (or vehicles), and mixing the obtained dispersions (in this case, it is possible to disperse the pigment dispersant in an organic solvent only); and (4) a method of dispersing the aforementioned pigment in an organic solvent (or a vehicle) and adding the pigment dispersant to the obtained dispersion.

The above-mentioned vehicle means a medium component which disperses the pigment when the coating is in a liquid phase, and includes a component (binder) which is liquid and combines with the pigment to cause solidification of the coated film, and a component (organic solvent) which dissolves and dilutes the above-mentioned binder.

A dispersing apparatus to be used in dispersing the above-mentioned pigment is not particularly limited, and there can be used a known dispersing apparatus such as a kneader, a roll mill, an atritor, a super mill, a dissolver, a homomixer or a sand mill.

In the case of using the colored photosensitive resin composition of the invention as a photomask, a pigment having an absorption in the ultraviolet region is employed. This is because the photomask of the invention is used in patternwise exposure of an ultraviolet-sensitive resist material. The pigment in such case can be composed, for example, solely of carbon black, but it is also possible to use dyes or pigments of blue, green, red, yellow or violet colors in combination. In the case where a particularly high sensitivity is desired, it is possible to singly use a blue pigment having a strong absorption in the ultraviolet region and a weak absorption in the wavelength region of the laser used, for example in the visible region of 440 to 500 nm, or to use a blue pigment and a yellow pigment in combination.

Examples of the above-mentioned blue pigment and yellow pigment include Victoria pure blue BO (C. I. 42595), Auramin (C. I. 41000), Fat black HB (C. I. 26150), Monolight yellow GT (C. I. Pigment Yellow 12), Permanent yellow GR (C. I. Pigment Yellow 17), Permanent yellow HR (C. I. Pigment Yellow 83), Permanent carmine FBB (C. I. Pigment Red 146), Hoster balm red ESB (C. I. Pigment Violet 19), Permanent ruby FBH (C. I. Pigment Red 11), Fastel pink B supra (C. I. Pigment Red 81), Monastoral fast blue (C. I. Pigment Blue 15), Monolight fast black B (C. I. Pigment Black 1), carbon, C. I. Pigment Red 97, C. I. Pigment Red 122, C. I. Pigment Red 149, C. I. Pigment Red 168, C. I. Pigment Red 177, C. I. Pigment Red 180, C. I. Pigment Red 192, C. I. Pigment Red 215, C. I. Pigment Green 7, C. I. Pigment Green 36, C. I. Pigment Blue 15:1, C. I. Pigment Blue 15:4, C. I. Pigment Blue 15:6, C. I. Pigment Blue 22, C. I. Pigment Blue 60, and C. I. Pigment Blue 64.

Also a dye may be used in combination if necessary, for example for the purpose of color hue adjustment.

The total amount of the pigment and the eventually added dye (namely the amount of coloring agent) in the solid components of the photosensitive composition is determined in consideration of the density of the photomask, the sensitivity and resolution in the preparation of the mask, and is variable depending on the kind of the coloring agent, but it is generally 10 to 50 mass %, and preferably 15 to 35 mass %.

In the photomask material of the invention, the composition of the photosensitive resin layer is preferably so adjusted that the absorbance of the photosensitive resin layer in the near ultraviolet or visible region in the preparation of the photomask is smaller than that of the photomask in the ultraviolet region in the use as a photomask. A photomask, prepared with a photomask material having such photosensitive resin layer, not only satisfactorily functions as a photomask because of the large absorbance in the ultraviolet region, but also shows an increase in the sensitivity, because the absorbance thereof in the near ultraviolet or visible region of the exposing light to be used in the preparation of the photomask is smaller, whereby the light is less absorbed and penetrates to the deep portion of the photosensitive resin layer without requiring an increase in the optical energy or a prolonged light irradiation. In particular, the absorbance in the near ultraviolet or visible region preferably does not exceed 1.5 in consideration of the sensitivity.

FIG. 1 shows the absorption spectrum of an example of the photomask material, provided with a photosensitive resin layer having such characteristics. It can be understood that the absorbance thereof in the near ultraviolet and visible regions is significantly lower than that in the ultraviolet region.

In order to obtain a photosensitive layer having the aforementioned characteristics, there can be selected a coloring material to be contained in the photosensitive resin layer, having an absorbance in the near ultraviolet and visible region smaller than that in the ultraviolet region. For example, the aforementioned blue pigments can be employed advantageously. It is also possible to increase the absorbance in the ultraviolet region, by adding an ultraviolet absorbent.

Other Components

The colored photosensitive resin composition of the invention can contain various additives for various purposes. Examples of such additives include a surfactant, an adhesion promoter and a plasticizer.

The above-mentioned surfactant can be used in order to improve the efficiency of the coating operation and the smoothness of the obtained coated film, and there can be used a fluorinated or silicone surfactant commercially available for example under the trade names of BM-1000 (manufactured by BM Chemie Co.), Megafacs F142D, F172, F173, F183, F178, F470, F475, F476 (manufactured by Dainippon Ink and Chemicals, Inc.), Florade FC-135, FC-170C, FC-430, FC-431 (manufactured by Sumitomo 3M Co.), Surflon S-112, S-113, S-131, S-141, S-145 (manufactured by Asahi Glass Co.), SH-28PA, SH-190, SH-193, SZ-6032, SF-8428, DC-57, DC-190 (manufactured by Toray Silicone Co.) and the like. The amount of the surfactant, with respect to 100 parts by mass of the total solid, preferably does not exceed 5 parts by mass, in particular does not exceeds 2 parts by mass.

Also in order to improve the adhesion of the resin layer to the substrate, an adhesion promoter may be included as an additive. A functional silane coupling agent can be advantageous utilized as such adhesion promoter. The functional silane coupling agent means a silane compound having a reactive substituent such as a carboxyl group, a methacryloyl group, an isocyanate group or an epoxy group, and examples thereof include trimethoxysilylbenzoic acid, γ-methacryloxypropyltrimethoxysilane, vinyltriacetoxysilane, vinyltrimethoxysilane, γ-isocyanatepropyltriethoxysilane, γ-glycidoxypropyltrimethoxysilane and β-(3,4-epoxycyclohexyl)ethyltrimethoxysilane. The amount of the adhesion promoter with respect to 100 parts by mass of the total solid is preferably at most 10 parts by mass, in particular 5 to 0.05 parts by mass.

Preparation of Photosensitive Resin Composition and Solution of Composition

The photosensitive resin composition of the invention can be prepared by uniformly mixing the aforementioned copolymer, the polymerizable monomer or oligomer, the photopolymerization initiator or photopolymerization initiating system, the pigment and, if necessary, other additives, and is usually prepared in the form of a solution of the composition, by dissolving each component in an organic solvent. The organic solvent used for this purpose can be any organic solvent which can dissolve each component or disperse a pigment if contained, and does not react with the components.

Examples of such organic solvent include alcohols such as methanol and ethanol; ethers such as tetrahydrofuran; glycol ethers such as ethylene glycol monomethyl ether, ethylene glycol dimethyl ether, ethylene glycol methyl ethyl ether and ethylene glycol monoethyl ether; ethylene glycol alkyl ether acetates such as methyl cellosolve acetate and ethyl cellosolve acetate; diethylene glycols such as diethylene glycol monomethyl ether, diethylene glycol diethyl ether, diethylene glycol dimethyl ether, diethylene glycol ethyl methyl ether, diethylene glycol monoethyl ether, and diethylene glycol monobutyl ether; propylene glycol alkyl ether acetates such as propylene glycol methyl ether acetate, and propylene glycol ethyl ether acetate; aromatic hydrocarbons such as toluene and xylene; ketones such as methyl ethyl ketone, cyclohexanone and 4-hydroxy-4-methyl-2-pentanone; and esters such as ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, ethyl acetate and butyl acetate. Among these, there can be advantageously employed glycol esters such as ethylene glycol dimethyl ether; ethylene glycol alkyl ether acetates such as ethyl cellosolve acetate; esters such as ethyl 2-hydroxypropionate, methyl 3-methoxypropionate and ethyl 3-ethoxypropionate; and diethylene glycols such as diethylene glycol dimethyl ether.

It is also possible to add a high-boiling solvent such as N-methylformamide, N,N-dimethylformamide, N-methylformanilide, N-methylacetamide, N,N-dimethylacetamide, N-methylpyrrolidone, dimethyl sulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate or phenyl cellosolve acetate.

Among these, there can be advantageously employed glycol esters such as ethylene glycol dimethyl ether, ethylene glycol alkyl ether acetates such as ethyl cellosolve acetate, esters such as ethyl 2-hydroxypropionate, methyl 3-methoxypropionate and ethyl 3-ethoxypropionate, and diethylene glycols such as diethylene glycol dimethyl ether because of the dissolving ability for the components and the ease of formation of a coated film. These organic solvents may be used alone or in a combination of two or more kinds.

Also, the solution of the composition of the invention can be used after being filtered for example with a microfilter of a pore size of 0.2 μm.

Formation of Photosensitive Coated Film

The photosensitive resin composition of the invention can be used in the following manner to form a coated photosensitive resin film on a transparent substrate.

(1) Coating Method

A prepared solution of the photosensitive resin composition is coated on a transparent substrate, and the solvent is removed ordinarily by heating the applied layer in an oven, thereby forming a coated film of the photosensitive resin composition. The coating method for the solution of the composition is not particularly limited, and various methods can be used for this purpose, such as a spray coating, a roller coating, a spin coating, a slit coating, an extrusion coating, a curtain coating, a die coating, a wire bar coating or a knife coating. The prebake conditions are dependent on the kinds and proportions of the components, but generally temperature thereof is 60 to 110° C. and prebake time is about 30 seconds to 15 minutes.

(2) Transfer Method of Photosensitive Resinous Transfer Material

A photosensitive resin transfer material is prepared by coating and drying a solution of the photosensitive resin composition of the invention on a temporary support, and the photosensitive resin layer is then transferred onto a transparent substrate by a laminator or the like, under heat and pressure. Advantageous conditions for the transfer are a temperature of a heat pressing roll within a range of 50 to 150° C. and a linear pressure at the time of pressing within a range of 5 to 25 kg/cm. The laminating speed is preferably 0.2 to 4 m/min in the conveying speed. Particularly preferable conditions are a temperature of the heat pressing roll of 130 to 140° C., a linear pressure at the time of pressing of 10 to 15 kg/cm and a conveying speed of 1 to 3 m/min.

Pattern Forming Method on Transparent Substrate

A pattern is formed by exposing the coated film, formed as explained in the foregoing, to light through a mask of a predetermined pattern, and carrying out a development process with a developer solution. The exposing light can be, for example, a light of g-line (wavelength 436 nm) or i-line (wavelength 365 nm), an ultraviolet light having continuous and/or discrete spectrum from a known light source such as an ultra high pressure mercury lamp, a xenon lamp, a carbon arc light or an argon laser, far ultraviolet light from a KrF excimer laser and the like, an X-ray such as a synchrotron radiation, or a charged particle ray such as an electron beam, and among them, an ultraviolet light of g- or i-line or a wavelength region of 300 to 440 nm including these lines is preferable. It is also possible, as described in JP-A No. 6-59119, to use in combination an optical filter or the like having an optical transmittance of 2% or less in a wavelength region of 400 nm or more.

In the case of employing a compound having an absorption in the ultraviolet region as the pigment, the image forming conditions such as exposure condition are different and will be explained later in the explanation of the method for producing a photomask.

The developer solution for the aforementioned photosensitive resin layer is a dilute aqueous solution of an alkaline substance, but an organic solvent miscible with water may be added thereto in a small amount. Examples of adequate alkaline substance include alkali metal hydroxides (such as sodium hydroxide or potassium hydroxide), alkali metal carbonates (such as sodium carbonate or potassium carbonate), alkali metal bicarbonates (such as sodium bicarbonate or potassium bicarbonate), alkali metal silicates (such as sodium silicate or potassium silicate), alkali metal metasilicates (such as sodium metasilicate or potassium metasilicate), ammonia, ethylamine, n-propylamine, diethylamine, triethylamine, methyldiethylamine, dimethylethanolamine, triethanolamine, diethanolamine, monoethanolamine, morpholine, tetraalkylammonium hydroxides (such as tetramethylammonium hydroxide or tetraethylammonium hydroxide), pyrrole, piperidine, 1,8-diazabicyclo[5,4,0]-7-undecene, 1,5-diazabicyclo[4,3,0]-5-nonane and trisodium phosphate.

The concentration of the alkaline substance is preferably 0.01 to 30 mass % and a pH is preferably 8 to 14.

Examples of the aforementioned water-miscible organic solvent include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam and N-methylpyrrolidone.

The concentration of the water-miscible organic solvent is generally 0.1 to 30 mass %.

The developer may contain a known surfactant, and the concentration thereof is preferably 0.01 to 10 mass %. The developer can be used as a bath or a spray liquid. The development can be carried out by puddle method, dipping method, reciprocation-immersion method, spray method and the like. In order to remove a development scum in a non-image area, there is preferably employed a method of rubbing with a rotary brush in the developer or with a wet sponge, or a method of utilizing the spray pressure of the sprayed developer. The temperature of the developer is preferably from room temperature to 40° C. A washing step with water may be conducted after the development process.

After the development process, the patterned thin film is subjected to a rinse process for example with running water, then exposed to a radiation from an ultra high pressure mercury lamp or an electron beam irradiating apparatus over the entire surface in order to further polymerize the unreacted ethylenic unsaturated bonds remaining in the thin film, and is further baked in a baking apparatus such as a hot plate or an oven thereby hardening such thin film. Such hardening process is carried out for example at a baking temperature of 150 to 250° C. and a baking time of 5 to 90 minutes (5 to 30 minutes in the case of baking on a hot plate, and 30 to 90 minutes in the case of baking in an oven). Thus, a thin film which is excellent in solvent resistance and transparency can be formed on the surface of the substrate.

Preparation of Photosensitive Transfer Material

Figure 2:
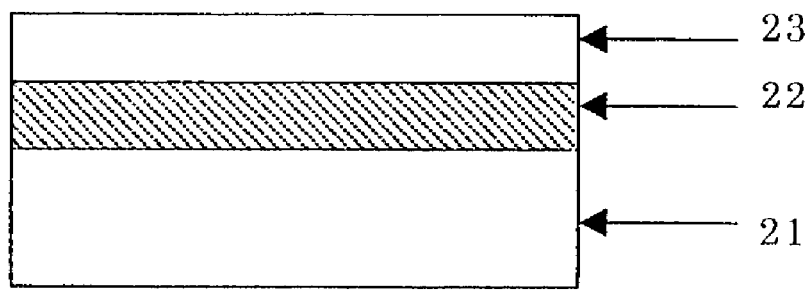
FIG. 2 is a cross-sectional view of a transfer material including a layer of a photosensitive thermo-setting resin of the invention.

The preparation of a photosensitive resin transfer material with the photosensitive resin composition of the invention is usually attained by coating the photosensitive resin composition, dissolved in a solvent, on a transparent plastic film (an example being shown in FIG. 2). Normally, a photosensitive resin layer 22 is coated and dried directly on a temporary subpport 21, comprising for example a polyethylene terephthalate (PET) film of a thickness of 5 to 30 μm, and, if necessary, a protective film 23 may be additionally adhered onto the photosensitive resin layer to prepare a transfer material.

Preparation of Multi-Layer Photosensitive Transfer Material

Figure 3:
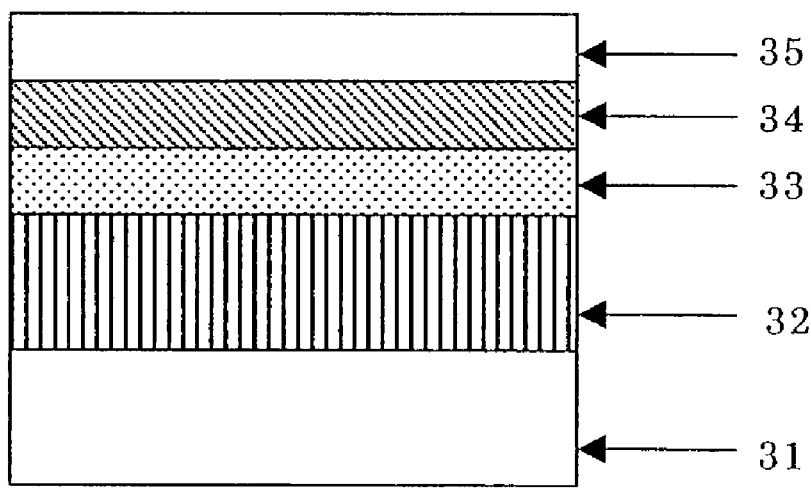
FIG. 3 is a cross-sectional view of a multi-layer transfer material including a layer of a photosensitive thermo-setting resin of the invention.

On the other hand, as disclosed in Japanese Patent No. 2794242 or JP-A No. 10-97061, there is already known a transfer material of a multi-layer configuration which can avoid bubble formation at the time of transfer, between the substrate and the photosensitive resin layer by the surface irregularities of the substrate (an example being illustrated in FIG. 3).

For example there can be advantageously used a multi-layered photosensitive resin transfer material, which is prepared in a method similar to that described in JP-A No. 10-97061, by coating a temporary support 31 in succession with an alkali-soluble thermoplastic resin layer 32, an intermediate layer 33 and a photosensitive resin layer 34 of the present invention, and laminating a protective film 35 thereon. A two-layered configuration without the intermediate layer is also usable. The photosensitive resin layer is formed by preparing a coating solution as explained above, and by coating and drying such a solution with a desired thickness on the alkali-soluble thermoplastic resin layer or the intermediate layer formed on the temporary support.

The thickness of the photosensitive resin layer is preferably 0.1 to 20 μm. A thickness less than 0.1 μm may result in a hardened film of insufficient durability, while a thickness exceeding 20 μm may result in drawbacks such as deterioration of the developability and the image reproducibility. The thickness of the photosensitive resin layer can be arbitrarily selected, within in the above-mentioned range, according to the required functions.

The temporary support is preferably composed of a material, which has satisfactory releasing property to the alkali-soluble thermoplastic resin layer, is chemically and thermally stable and is flexible. More specifically preferable is a thin sheet of Teflon®, polyethylene terephthalate, polyethylene naphthalate, polyallylate, polycarbonate, polyethylene or polypropylene or a laminate thereof. In order to obtain satisfactory releasing property, the support is usually not subjected to a surface treatment such as glow discharge, nor provided with a subbing layer such as of gelatin. The thickness of the temporary support is preferably 5 to 300 μm, and more preferably 10 to 150 μm. A thickness less than 5 μm may result in an elongation because of the insufficient tensile strength at the time of lamination, thus forming undesirable creases. Also a thickness exceeding 300 μm may limit the speed of lamination, because the heat conduction is delayed in thermal lamination.

The resin constituting the alkali-soluble thermoplastic resin layer preferably has a practical softening point not exceeding 80° C. The alkali-soluble thermoplastic resin of a softening point not exceeding 80° C. is preferably at least one selected from saponification products of ethylene-acrylic acid ester copolymers, saponification products of styrene-(meth)acrylic acid ester copolymers, saponification products of vinyltoluene-(meth)acrylic acid ester copolymers, poly(meth)acrylic acid esters, and saponification products of (meth)acrylic acid ester copolymers, such as butyl (meth)acrylate-vinyl acetate but there may also be used those soluble in an aqueous alkali solution, among the organic polymers having softening points not exceeding about 80° C., described in the "Plastic Performance Handbook" (edited by Japan Plastic Industries Union and All-Japan Plastic Molding Industries Society; published by Industrial Research Association; Oct. 25, 1968).

It is also possible to use the organic polymer substances having a softening point higher than 80° C. with a plasticizer which is compatible with such organic polymer substances and can reduce the softening point of the polymer to 80° C. or lower. Also in order to regulate the adhesive force between the resin layer and the temporary support, it is furthermore possible to add, to such organic polymer substances, various polymers, a supercooling substance, an adhesion promoter, a surfactant, a releasing agent and the like within such extent that the practical softening point does not exceed 80° C. Preferable examples of the plasticizer include polypropylene glycol, polyethylene glycol, dioctyl phthalate, diheptyl phthalate, dibutyl phthalate, tricresyl phosphate, cresyldiphenyl phosphate and biphenyldiphenyl phosphate.

The thickness of the thermoplastic resin layer is preferably 5 μm or more. In the case where the thickness of the thermoplastic resin layer is less than 5 μm, it becomes difficult to completely absorb the surface irregularities of 1 μm or larger on the underlayer. Also the upper limit of the thickness is about generally 100 μm or less, preferably about 50 μm or less, in consideration of the developability and the manufacturability.

The intermediate layer is provided for intercepting oxygen at the time of exposure, and for preventing undesirable mixing of the thermoplastic resin layer and the photosensitive resin layer. The intermediate layer can be composed of any known material that can be dispersed or dissolved in water or an aqueous alkali solution and shows low oxygen permeation. For example, there can be used polyvinyl ether/maleic anhydride copolymers described in JP-A No. 46-2121 and JP-B No. 56-40824, water-soluble salts of carboxyalkyl cellulose, water-soluble cellulose ethers, salts and aqueous salts of carboxyalkyl starch, polyvinyl alcohol, polyvinylpyrrolidone, polyacrylamides, water-soluble polyamides, water-soluble salts of polyacrylic acid, gelatin, ethylene oxide polymers, water-soluble salts of various starches and analogs thereof, styrene/maleic acid copolymers, a maleinate resin or a mixture of two or more of the foregoing.

A combination of polyvinyl alcohol and polyvinylpyrrolidone is particularly preferable. The polyvinyl alcohol preferably has a saponification rate of 80 mol % or higher, and the content of polyvinylpyrrolidone is generally 1 to 75 mass % of the solid of the oxygen intercepting layer, preferably 1 to 60 mass %, and more preferably 10 to 50 mass %. The content of polyvinylpyrrolidone of less than 1 mass % does not provide sufficient adhesion to the photosensitive resin layer, while the content exceeding 75 mass % results in a loss in the oxygen intercepting ability. The thickness of the oxygen intercepting layer can be very small, and is preferably about 0.1 to 5 µm, and particularly 0.5 to 2 µm. A thickness less than about 0.1 µm may lead to an excessively high oxygen permeability, while a thickness exceeding about 5 µm may require an excessively long time in the development or in the removal of the oxygen intercepting layer. A multi-layered photosensitive resin transfer material of the invention can be obtained by forming the aforementioned photosensitive resin layer on the intermediate layer.

It is desirable to provide a thin protective film for avoiding deposition of impurities or damage during storage. The protective film can be composed of a material same as or similar to that of the temporary support, but has to be easily peelable from the photosensitive resin layer. The smoothness of the surface of the protective film which surface is laminated on the photosensitive resin layer is important, and as a projection of about 0.1 µm causes a damage to the photosensitive resin layer. Such protective film is preferably composed of a silicone-impregnated paper, or a polyolefin or polytetrafluoroethylene sheet, and more preferably a polypropylene or polyethylene film. The thickness of the protective film is preferably about 5 to 100 µm, and particularly preferably 7 to 15 µm.

Color Filter

In the following there will be explained a method of the invention for forming a multi-color image (color filter). The color filter of the invention can be prepared by carrying out the following steps in succession for each of R, G and B pixels:

(1) a step of forming a colored photosensitive layer on a substrate, by adhering a photosensitive sheet comprising the aforementioned resin composition, which is formed as a sheet and contains a photopolymerizable compound, a photopolymerization initiator and a binder and in which a pigment is dispersed;

(2) a step of patternwise exposing the colored photosensitive layer;

(3) a step of developing the exposed colored photosensitive layer to obtain a colored layer which is patterned and hardened, and formed of the exposed portion of the colored photosensitive layer; and (4) a step of heating the above-mentioned colored layer, patterned and hardened, thereby achieving sintering and further hardening.

The above-mentioned step (1) may also be achieved by coating and drying a photosensitive dispersion directly on the surface of the substrate, but it is preferred to employ a method of at first forming a colored photosensitive layer on a separately prepared temporary support (a flexible plastic sheet) thereby obtaining a photosensitive sheet, and then transferring the photosensitive layer of such photosensitive sheet onto the surface of the substrate. The above-mentioned substrate can be suitably selected for example from a glass plate and a plastic film of polyethylene terephthalate, polyether sulfone, polyimide, epoxy resin and the like.

The above-mentioned colored photosensitive layer is then subjected to the step (2) of patternwise exposure with a photomask or the like, and then to the step (3) of development with a developer solution thereby dissolving and removing a portion not exposed to the light irradiation. In this manner, a colored layer, patterned and hardened, can be obtained on the substrate, corresponding to the exposed portion of the colored photosensitive layer.

The aforementioned steps (1) to (3) are commonly employed in the image forming method utilizing a photosensitive transfer material, and are described for example in JP-A No. 5-173320. As a representative image forming method, there may be employed a method including steps of laying the photosensitive resin composition layer of the photosensitive transfer material on the surface of a transparent substrate to be installed in a liquid crystal display device, then peeling off the support of the transfer material and patternwise exposing the photosensitive resin composition layer to light through a photomask, heating the photosensitive resin layer, and developing the photosensitive resin layer by dissolving and removing the unexposed portion of the resin layer.

Photomask

In the following there will be explained a method of the invention for forming a photomask.

The preparation of the photomask is achieved by image formation by exposing the photosensitive resin layer of the aforementioned photomask material to near ultraviolet or visible light, and developing the resin layer. In the case of using a photosensitive resin transfer material, there can be employed a colored photosensitive resin transfer material prepared by coating a colored photosensitive resin layer on a PET (polyethylene terephthalate) base film coated in advance with a peelable layer and an oxygen intercepting layer, and by laminating a protective film thereon. The photomask can be prepared by peeling off the protective film from the transfer material, then laminating the transfer material onto a transparent substrate such as a glass plate thereby forming a photomask blank, peeling off the PET base film, exposing the photosensitive resin layer to light with, for example, a laser drawing equipment, and developing the photosensitive resin layer and rinsing the developed resin layer. The strength of the film can be increased, if necessary, by a post exposure or a postbake. It is also possible to form a transparent protective film in order to improve the durability of the formed image. It is furthermore possible to carry out the exposure through the temporary support or the transparent substrate without peeling off the temporary support, and to peel off the temporary support before the development.

For the image formation of the photomask material of the invention, a laser exposure can be advantageously employed. More specifically a HeCd laser (442 nm) or an argon laser (488 nm) can be utilized, but such examples are not restrictive.

The developer to be used in the invention is, for example, an aqueous solution of a hydroxide, a carbonate or a bicarbonate of an alkali metal or an alkali earth metal, aqueous ammonia or a solution of a quaternary ammonium salt, and preferably an aqueous solution of sodium carbonate.

In the invention, it is also possible to improve the strength of the film, after the image formation in the photosensitive layer on the transparent substrate, by heating such photosensitive layer within a range of 120 to 250° C. A temperature lower than 120° C. does not provide the effect of heating, while a temperature exceeding 250° C. induces decomposition of the materials, thereby resulting in a fragile and weak film. The process time is preferably 15 to 60 minutes, and the heating can be achieved by a known means such as a dry oven or a hot plate.

Also in the method of the invention for producing the photomask, if the prepared photomask has a defect, such defect can be repaired in the following manner.

A defect in the photomask means, in a black portion, principally a transparent void, for example a light-transmitting defect such as a pinhole, and, in a transparent portion, a defect which reduces the optical transmittance by the presence of a particle or a photosensitive layer on the transparent substrate, in a portion which should be transparent.

In the case a transparent void defect is generated in a black portion, such defect can be repaired by coating a solution of the aforementioned photosensitive layer around the defect or locally applying the aforementioned photosensitive transfer material with, for example, a laminator, and carrying out exposure for example with a HeCd laser and development to eliminate the unnecessary photosensitive layer. Instead of the exposure with HeCd laser and the development, the unnecessary portion may be eliminated by ablation with a YAG laser.

On the other hand, a defect in a transparent portion can be removed by ablation with a YAG laser or the like. In contrast to the case of an Em mask, the laser ablation does not cause generation of any new defects, since organic components such as the photosensitive layer are not present in portions of the transparent portion other than in the defects themselves.

In the invention, a protective film composed of, for example, a thermosetting epoxy resin may be provided on the image of the photomask material after the formation thereof, thereby further improving the material strength.

Also in the case of utilizing the photomask of the invention for patterning an ultraviolet-sensitive resist, it is possible to select the exposure wavelength by incorporating a band-pass filter in the ultraviolet exposure equipment utilizing, for example, an ultra high pressure mercury lamp.

The photosensitive resin composition of the invention, in an application to the preparation of a photomask, can achieve image formation by incorporating a coloring material having an absorption in the ultraviolet region, then forming a photosensitive layer which is sensitive to the near ultraviolet or visible light on a transparent substrate, and exposing the resin layer to the near ultraviolet or visible light and developing the resin layer to eliminate the unnecessary portion of the photosensitive layer, whereby an inexpensive photomask can be prepared with a simple process and with a high yield and a defect therein can be easily repaired. In particular, a method of laminating the photosensitive transfer material onto the transparent substrate allows to produce a photomask featured by a uniform film thickness, few defects and excellent reproducibility of a large-sized image. Also the sensitivity and the resolution are well balanced.

EXAMPLES

In the following, the present invention will be further clarified by examples, but it is to be understood that the invention is by no means limited to such examples. "Part" in the examples means "part by weight".

Synthesis Example 1

180 parts of 1-methoxy-2-acetoxy propane were charged in a reaction vessel and heated under a nitrogen flow so that the internal temperature of the vessel was 70° C. Then a solution in which 17.1 parts of methacrylic acid, 42.9 parts of allyl methacrylate, 30.0 parts of benzyl methacrylate (composition ratio of these methacrylic acid and esters thereof was 28:48:24 in molar ratio), 2.87 parts of dodecylmercaptane and 3.52 parts of V-65 (2,2'-azobis-(2,4'-dimethylvaleronitrile), manufactured by Wako Pure Chemical Co.) were dissolved in 180 parts of 1-methoxy-2-acetoxypropane was dropwise added into the vessel over a period of 2.5 hours. The mixture was agitated further for 2 hours under heating at 70° C. to obtain a methacrylic acid/allyl methacrylate/benzyl methacrylate terpolymer (terpolymer 1). The weight-average molecular weight of the terpolymer was 33,000 (converted as polystyrene).

Synthesis Example 2

803 parts of 1-methoxy-2-acetoxypropane were charged in a reaction vessel and heated under a nitrogen flow so that the internal temperature of the vessel was 70° C. Then a solution in which 54.0 parts of methacrylic acid, 135.6 parts of allyl methacrylate, 90.4 parts of cyclohexyl methacrylate (composition ratio of these methacrylic acid and esters thereof was 28:48:24 in molar ratio), 4.53 parts of dodecylmercaptane and 11.1 parts of V-65 (2,2'-azobis-(2,4'-dimethylvaleronitrile), manufactured by Wako Pure Chemical Co.) were dissolved in 803 parts of 1-methoxy-2-acetoxypropane was dropwise added into the vessel over a period of 2.5 hours. The mixture was agitated further for 2 hours under heating at 70° C. to obtain a methacrylic acid/allyl methacrylate/cyclohexyl methacrylate terpolymer (terpolymer 2). The weight-average molecular weight of the terpolymer was 36,000 (converted as polystyrene).

Synthesis Example 3

427.5 parts of 1-methoxy-2-propanol were charged in a reaction vessel and heated under a nitrogen flow so that the internal temperature of the vessel was 70° C. Then a solution in which 18.5 parts of methacrylic acid, 46.5 parts of allyl methacrylate, 29.9 parts of benzyl acrylate (composition ratio of these methacrylic acid and esters was 28:48:24 in molar ratio), and 3.82 parts of V-65 (2,2'-azobis-(2,4'-dimethylvaleronitrile), manufactured by Wako Pure Chemical Co.) were dissolved in 427.5 parts of 1-methoxy-2-propanol was dropwise added into the vessel over a period of 2.5 hours. The mixture was agitated further for 2 hours under heating at 70° C. The obtained reaction liquid was poured into 5000 parts of water, and the resulting solid was separated by filtration and dried under vacuum to obtain a methacrylic acid/allyl methacrylate/benzyl acrylate terpolymer (terpolymer 3). The weight-average molecular weight of the terpolymer was 36,000 (converted as polystyrene).

Synthesis Example 4

405 parts of 1-methoxy-2-propanol were charged in a reaction vessel and heated under a nitrogen flow so that the internal temperature of the vessel was 70° C. Then a solution in which 16.0 parts of methacrylic acid, 25.1 parts of allyl methacrylate, 49.0 parts of benzyl methacrylate (composition ratio of these methacrylic acid and esters thereof was 28:30:42 in molar ratio), 3.29 parts of V-65 (2,2'-azobis-(2,4'-dimethylvaleronitrile), manufactured by Wako Pure Chemical Co.) were dissolved in 405 parts of 1-methoxy-2-propanol was dropwise added into the vessel over a period of 2.5 hours. The mixture was agitated further for 2 hours under heating at 70° C. The obtained reaction liquid was poured into 4000 parts of water, and the resulting solid was separated by filtration and dried under vacuum to obtain a methacrylic acid/allyl methacrylate/benzyl methacrylate terpolymer (terpolymer 4). The weight-average molecular weight of the terpolymer was 36,000 (converted as polystyrene).

Synthesis Example 5

A methacrylic acid/allyl methacrylate/benzyl methacrylate terpolymer (terpolymer 5) was produced in the same manner as in synthesis example 3 except that 17.4 parts of methacrylic acid were changed to 16.0 parts, 43.6 parts of allyl methacrylate changed to 25.1 parts, 29.1 parts of cyclohexyl methacrylate were changed to 49.0 parts of benzyl methacrylate (composition ratio of these methacrylic acid and esters thereof was 28:30:42 in molar ratio), and 3.58 parts of V-65 (Wako Pure Chemical Co.) were changed to 3.29 parts. The weight-average molecular weight of the terpolymer was 17,000 (converted as polystyrene).

Comparative Synthesis Example 1

398.7 parts of 1-methoxy-2-propanol were charged in a reaction vessel and heated under a nitrogen flow so that the internal temperature of the vessel was 70° C. Then a solution in which 12.9 parts of methacrylic acid, 75.7 parts of allyl methacrylate (composition ratio of these methacrylic acid and ester thereof was 20:80 in molar ratio), and 3.73 parts of V-65 (2,2'-azobis-(2,4'-dimethylvaleronitrile), manufactured by Wako Pure Chemical Co.) were dissolved in 398.7 parts of 1-methoxy-2-propanol was dropwise added into the vessel over a period of 2.5 hours. The mixture was agitated further for 2 hours under heating at 70° C. The obtained reaction liquid was poured into 4000 parts of water, and the resulting solid was separated by filtration and dried under vacuum to obtain a methacrylic acid/allyl methacrylate copolymer (copolymer 6). The weight-average molecular weight of the copolymer was 36,000 (converted as polystyrene).

Comparative Synthesis Example 2

405 parts of 1-methoxy-2-propanol were charged in a reaction vessel and heated under a nitrogen flow so that the internal temperature of the vessel was 70° C. Then a solution in which 16.4 parts of methacrylic acid, 41.2 parts of allyl methacrylate, 32.4 parts of 2-ethylhexyl methacrylate (composition ratio of these methacrylic acid and esters thereof was 28:48:24 in molar ratio), 3.38 parts of V-65 (2,2'-azobis-(2,4'-dimethylvaleronitrile), manufactured by Wako Pure Chemical Co.) were dissolved in 405 parts of 1-methoxy-2-propanol was dropwise added into the vessel over a period of 2.5 hours. The mixture was agitated further for 2 hours under heating at 70° C. The obtained reaction liquid was poured into 4000 parts of water, and the resulting solid was separated by filtration and dried under vacuum to obtain a methacrylic acid/allyl methacrylate/2-ethylhexyl methacrylate terpolymer (terpolymer 7). The weight-average molecular weight of the terpolymer was 39,000 (converted as polystyrene).

Comparative Synthesis Example 3

160 parts of a methacrylic acid/benzyl methacrylate copolymer with a molar ratio 48/52, 1.1 parts of triethylbenzylammonium chloride, and 0.24 parts of di-t-hexyl hydroquinone were dissolved in 240 parts of 1-methoxy-2-acetoxypropane. The solution was heated in a vessel so that the internal temperature of the vessel was 80° C., and a solution in which 34.2 parts of glycidyl methacrylate was dissolved in 51.3 parts of 1-methoxy-2-acetoxypropane was dropwise added into the vessel. The mixture was agitated further for 8 hours under heating at 80° C. to obtain a resin in which a part of the carboxyl groups of a methacrylic acid/benzyl methacrylate copolymer was modified to side-chain methacryloyl groups (copolymer 8) (composition ratio of parts of methacrylic acid, benzyl methacrylate and methacrylic acid and glycidyl methacrylate added is 28:58:20 in molar ratio). The weight-average molecular weight of the copolymer was 26,000 (converted as polystyrene).

Example 1

A coating liquid of the following composition (H1) was coated on a temporary support comprising a polyethylene terephthalate (PET) film of a thickness of 75 μm, and dried to obtain a thermoplastic resin layer with a dry film thickness of 20 μm:

<Composition of Coating Liquid for Forming Thermoplastic Resin Layer: H1> methyl methacrylate/2-ethylhexyl acrylate/benzyl methacrylate/methacrylic acid copolymer (copolymerization ratio (mole)=55/11.7/4.5/28.8, weight-average molecular weight=80,000): 15.0 parts by mass BPE-500 (polyfunctional acrylate, manufactured by Shin Nakamura Kagaku Co.): 7.0 parts by mass F177P (fluorinated surfactant, manufactured by Dainippon Ink and Chemicals, Inc.): 0.3 parts by mass methanol: 30.0 parts by mass methyl ethyl ketone: 19.0 parts by mass and 1-methoxy-2-propanol: 10.0 parts by mass.

A coating liquid of the following composition (B1) was then coated on the above-described thermoplastic resin layer, and dried to obtain an intermediate layer with a dry film thickness of 1.6 μm:

<Composition of Coating Liquid for Forming Intermediate Layer: B1> polyvinyl alcohol (PVA205 manufactured by Kuraray Co., saponification degree: 80 mol %): 130 parts by mass polyvinylpyrrolidone (K-30 manufactured by GAF Corp.): 60 parts by mass distilled water: 2110 parts by mass methanol: 1750 parts by mass Then, a coating liquid of the following composition (R1) was coated on the intermediate layer described above and dried to obtain a photosensitive resin layer with a dry film thickness of 2.5 μm, and a polypropylene covering sheet (thickness 12 μm) was adhered to the photosensitive resin layer by pressing and a multi-layered red-color photosensitive transfer material was thus obtained.

Also multi-layered photosensitive transfer materials of green (G) color and blue (B) color were prepared by a same process except that the coating liquid (R1) was respectively replaced by those (G1) and (B1):

<Coating Liquids for Colored Photosensitive Resin Layer>

TABLE 1

|  | R1 | G1 | B1 |
|---|---|---|---|
| Benzyl methacrylate/methacrylic acid copolymer (mol. ratio = 73/27; mol. wt. = 30,000) |  |  | 1.1 |
| Terpolymer 1 of Synthesis ex. 1 | 2.1 | 2.2 | 2.7 |
| Dipentaerythritol hexaacrylate | 4.2 | 5 | 4.7 |
| Fluorinated surfactant (Megafac F176, Dainippon Ink and Chemicals, Inc.) | 0.06 | 0.24 | 0.13 |
| 7-[2-[4-(3-hydroxymethylpiperidino)-6-diethylamino]triazylamino]3-phenylcoumarine | 1.5 | 1.3 |  |
| 2-trichloromethyl-5-(p-styrylstyryl)-1,3,4-oxadiazole | 0.45 | 0.31 | 0.27 |

TABLE 1-continued

|  | R1 | G1 | B1 |
|---|---|---|---|
| Phenothiazine | 0.01 | 0.007 | 0.022 |
| C.I.PR254 dispersion (RT-107; Fujifilm Olin Co.) | 21.0 | | |
| C.I.PG36 dispersion (GT-2; Fujifilm Olin Co.) | | 15.8 | |
| C.I.PY138 dispersion (YT-123; Fujifilm Olin Co.) | | 11.2 | |
| C.I.PB15:6 dispersion (MHI blue 7075M; Mikuni Shikiso Co.) | | | 32.56 |
| Propylene glycol monomethyl ether acetate | 25 | 20 | 12 |
| Methyl ethyl ketone | 35 | 39 | 43 |

Example 2

A transfer material of Example 2 was prepared in the same manner as in the Example 1, except that the terpolymer 1, obtained in the Synthesis Example 1 and employed in the Example 1, was replaced by the terpolymer 2 of the Synthesis Example 2.

Comparative Example 1

A transfer material of Comparative Example 1 was prepared in the same manner as in the Example 1, except that the terpolymer 1, obtained in the Synthesis Example 1 and employed in the Example 1, was replaced by a benzyl methacrylate/methacrylic acid copolymer (molar ratio=73/27, molecular weight 30,000).

Comparative Example 2

A transfer material of Comparative Example 2 was prepared in the same manner as in the Example 1, except that the terpolymer 1, obtained in the Synthesis Example 1 and employed in the Example 1, was replaced by the copolymer 6 of the Comparative Synthesis Example 1.

Preparation of Color Filter

The colored transfer materials of the Examples 1 to 2 and the Comparative Examples 1 to 2 were used in the following manner to obtain color filters of the Examples 1 to 2 and the Comparative Examples 1 to 2.

A transparent glass substrate (#7059; Corning Glass Corp.) of a thickness of 1.1 mm and a dimension of 400 mm×300 mm was washed, immersed for 3 minutes in a 1% aqueous solution of a silane coupling agent (KBM-603; Shin-etsu Chemical Co.), then rinsed with deionized water for 30 seconds to remove excessive silane coupling agent, and, after removal of excessive water, heat-treated in an oven for 20 minutes at 110° C. The covering sheet of a colored transfer material for R layer (red image forming material) was peeled off and the surface of the photosensitive resin composition layer was adhered to the transparent glass substrate processed with the silane coupling agent, with a laminator (Auto Cut Laminator ASL-24; Somal Co.) under pressurizing (10 kg/cm) and heating. Subsequently the temporary support was removed by peeling at the interface between the temporary support and the thermoplastic resin layer. Then an exposure through a predetermined photomask and a development were carried out to eliminate unnecessary portions, and an ultraviolet irradiation of 300 mJ/cm$^2$ was carried out with an ultra high pressure mercury lamp from a side opposite to the color filter bearing surface, thereby forming a pattern of red pixels on the transparent glass substrate. Subsequently, a colored transfer material for G layer (green image forming material) was adhered onto the glass substrate bearing the formed red pixel pattern in a similar manner as explained above, and subjected to the steps of peeling, exposure, development, and post-exposure to obtain a pattern of green pixels. Then a similar process was repeated with a colored transfer material for B layer (blue image forming material), whereby a color filter was obtained on the transparent glass substrate.

The conditions of transfer, exposure, development and post exposure are shown in Table 2.

TABLE 2

| Color | Transfer temp. (° C.) | Transfer speed (m/min) | Exposure (mJ) | Development 1 (sec) | Development 2 (sec) | Post exp. (mJ) |
|---|---|---|---|---|---|---|
| R layer | 130 | 0.2 | 20 | 70 | 50 | 300 |
| G layer | 140 | 0.2 | 20 | 70 | 25 | 300 |
| B layer | 150 | 0.2 | 20 | 70 | 60 | 300 |

Other conditions and supplementary explanations for Table 2 are shown below:

Development 1: A development, for dissolving and removing the thermoplastic resin layer and the intermediate layer, was conducted by a shower development with a 1% aqueous solution of triethanolamine as the developer, at 33° C.;

Development 2: A development, for developing the color photosensitive resin composition layer, was conducted by a shower development with a 1% aqueous solution Color Mosaic developer CD-1000 (manufactured by Fuji Hunt Electronics Technology Co.), at 33° C.

The color filter prepared under the aforementioned conditions was free from pixel voids (white voids) and showed little side etch in each pixel, thus having satisfactory properties as the color filter.

Evaluation Tests

Solvent Resistance Test

The above-described color filter was cut into pieces, and the solvent resistance was evaluated by immersing the cut piece in N-methylpyrrolidone for 30 minutes and observing the surface state (presence of crack formation) of the cut piece of the color filter under a differential interference microscope. The obtained results are shown in Table 3.

TABLE 3

|  | Adhesion | Solvent resistance |
|---|---|---|
| Example 1 | 100% | satisfactory |
| Example 2 | 100% | satisfactory |
| Example 3 | 100% | satisfactory |
| Example 4 | 100% | satisfactory |
| Example 5 | 100% | satisfactory |
| Comparative Example 1 | 65% | satisfactory |
| Comparative Example 2 | 100% | cracked |

Each of the transfer materials showed a satisfactory alkali developing time of 30 to 20 seconds, and a high resolution of 10 to 14 μm. Also these transfer materials were subjected to a similar process after standing for 4 days at 50° C., and there was confirmed the absence of change in the performance such as developability (satisfactory stability in time).

Preparation of Evaluation Sample for Hardness and Solvent Resistance

The covering sheet of a colored resin transfer material, obtained in each of the foregoing examples and comparative examples, was peeled off and the transfer resin layer was laminated on a glass substrate at 100° C. and under a linear pressure of 2 kg/cm. Subsequently the polyethylene terephthalate film alone was peeled off, whereby the transfer material was transferred onto the glass. Then an ultraviolet irradiation of 100 mJ/cm$^2$ was applied over the entire surface and a development process was carried out to remove the thermoplastic resin layer, thereby leaving a color layer only on the glass substrate. This process was similarly repeated 8 times to superpose 8 colored layers, which were then postbaked for 1 hour at 220° C. or for 1 hour at 250° C. to obtain a hardened layer.

Measurement of Film Hardness

The obtained hardened film was subjected to the measurement of a plastic deformation amount, by a hardness meter MZT (manufactured by Akashi Co.). In the measurement, a smaller value indicates a better result.

Solvent Resistance

The obtained hardened film was immersed in N-methylpyrrolidone for 30 minutes, and was then subjected to the observation of crack formation state on the film surface. Table 4 shows the obtained results, in which + indicates absence of cracks, ± indicates cracks observed in apart, and − indicates cracks observed over the entire surface or a partial film peeling.

TABLE 4

| Postbake condition | Plastic deformation amt (μm) | | Solvent resistance |
| --- | --- | --- | --- |
|  | 220° × 1 hr. | 250° C. × 1 hr. | 220° C. × 1 hr. |
| R1 (Example 1) | 1.31 | 1.20 | + |
| G1 | 1.33 | 1.20 | + |
| B1 | 1.28 | 1.22 | + |
| R2 (Example 2) | 1.30 | 1.24 | + |
| G2 | 1.29 | 1.22 | + |
| B2 | 1.27 | 1.19 | + |
| Comp. Ex. 1 R | 1.42 | 1.33 | − |
| Comp. Ex. 1 G | 1.40 | 1.32 | − |
| Comp. Ex. 1 B | 1.43 | 1.35 | − |
| Comp. Ex. 2 R | 1.39 | 1.29 | ± |
| Comp. Ex. 2 G | 1.40 | 1.29 | ± |
| Comp. Ex. 2 B | 1.41 | 1.30 | ± |

The results in the table indicate that the hardened films of the Examples had a higher hardness than that of the hardened films of the Comparative Examples, that the bake condition of 220° C.×1 hr. in the Examples provided a hardness equal to that of 250° C.×1 hr. in the Comparative Examples, and that the Examples showed a higher solvent resistance than the Comparative Examples.

Example 3

<(1) Preparation of Colored Photosensitive Transfer Material>

A coating liquid of the following formulation was coated on a PET temporary support of a thickness of 100 μm, and dried to obtain a peelable layer of a dry film thickness of 0.7 μm.

<Formulation of Peelable Layer> methyl methacrylate/2-ethylhexyl acrylate/benzyl methacrylate/methacrylic acid copolymer (copolymerization molar ratio=55/12/5/28, weight-average molecular weight= 95,000, Tg≅73° C.): 7 parts by mass styrene/acrylic acid copolymer (copolymerization molar ratio=63/37, weight-average molecular weight=10,000, Tg ≅100° C.): 16.33 parts by mass BPE-500 (compound formed by dehydration condensation product of 2 equivalents of octaethylene glycol monomethacrylate to bisphenol-A; manufactured by Shin Nakamura Chemical Co.): 10.89 parts by mass F176P (fluorinated surfactant; manufactured by Dainippon Ink and Chemicals, Inc.): 1.96 parts by mass Methyl ethyl ketone: 508.1 parts by mass Methanol: 13.32 parts by mass Methoxypropanol: 7.44 parts by mass and 1-methoxy-2-propyl acetate: 231.9 parts by mass.

Then, a coating liquid of the following formulation was coated on the above-described peelable layer, and dried to obtain an oxygen intercepting layer of a dry film thickness of 1.6 μm.

<Formulation of Oxygen Intercepting Layer>

Polyvinyl alcohol (PVA205 manufactured by Kuraray Co.; saponification rate=80%): 21.2 parts by mass Polyvinyl pyrrolidone (K-30: manufactured by GAF Corp.): 2.35 parts by mass Methanol: 214 parts by mass and Distilled water: 262 parts by mass.

Then, a colored photosensitive formulation, prepared with the G and Y pigment dispersions as shown in the following, was applied to the above-mentioned oxygen intercepting layer so that the thickness thereof was 3 μm, and a polypropylene film of a thickness of 12 μm was laminated as a protective layer on the above-mentioned photosensitive layer, thereby obtaining a colored photosensitive transfer material.

<Formulation of Colored Photosensitive Layer>

Green pigment dispersion: 7.80 parts by mass

Yellow pigment dispersion: 26.89 parts by mass

Terpolymer 1 of the Synthesis Example 1: 0.273 parts by mass

Dipentaerythritol hexaacrylate (DPHA; manufactured by Nippon Kayaku Co.): 8.284 parts by mass The Following Compound A: 0.621 Parts by Mass Irgacure 784 (manufactured by Ciba Specialty Chemicals, Co.): 1.243 parts by mass The Following Compound B: 1.864 Parts by Mass Hydroquinone monomethyl ether: 0.004 parts by mass F176P (fluorinated surfactant; manufactured by Dainippon Ink and Chemicals, Inc.): 0.025 parts by mass Methyl ethyl ketone: 82.28 parts by mass and 1-methoxy-2-propyl acetate: 7.94 parts by mass

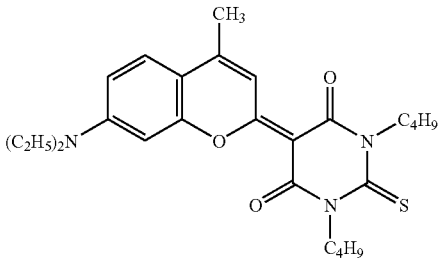

Compound A

Compound B

[Chemical structure of Compound B: CH₃S-C₆H₄-C(=N-C(CH₃)₂-N(morpholine))-O-CH₂-C(=O)-O-CH₂-C₆H₄-CH=CH₂]

The above-mentioned green and yellow pigment dispersions were prepared in the following manner.

<Preparation of Green Pigment Dispersion>

The following green pigment composition was subjected to dispersion with a motor mill M-200 (manufactured by Eiger Co.), utilizing zirconia beads of a diameter of 1.0 mm, for 5 hours at a circumferential speed of 9 m/s to obtain a green pigment dispersion:

C. I. Pigment Green 36: 45 parts by mass

The Following Compound C: 0.9 Parts by Mass

Terpolymer 1 of the Synthesis Example 1: 45 parts by mass and 1-methoxy-2-propyl acetate: 359.1 parts by mass.

Compound C

[Chemical structure of Compound C]

<Preparation of Yellow Pigment Dispersion>

The following yellow pigment composition was subjected to dispersion in a similar manner as in the foregoing green pigment dispersion to obtain a yellow pigment dispersion:

C. I. Pigment Yellow 139: 45 parts by mass

Compound C: 2.25 Parts by Mass

Terpolymer 1 of the Synthesis Example 1: 45 parts by mass and 1-methoxy-2-propyl acetate: 357.25 parts by mass.

<(2) Preparation of Photomask>

At first, the photosensitive layer of the colored transfer material, from which the protective polypropylene film was peeled off, was laminated on a soda-lime glass substrate which had been subjected to alkali washing with a laminator MDL601 (manufactured by Muromachi Chemical Co.) under heating at 130° C. to obtain a photomask blank. The alkali washing of the glass substrate was conducted by immersing the glass substrate in Semico Clean SE10 (Furuuchi Kagaku Co.), applying ultrasonic wave for 15 minutes, rinsing with deionized water and drying for 10 minutes at 110° C.

Then the PET base film was peeled off from the photomask blank, and exposure was made with a laser plotter FR7000 (manufactured by Dainippon Screen Co.) with a NdYAG laser of a wavelength of 532 nm as the light source. Then the photomask blank was developed by immersing it in an alkali developer liquid (a 10% aqueous solution of TCD manufactured by Fuji Photo Film Co.) for 120 seconds at 28° C., rinsed with deionized water and dried. Subsequently it was heated for 30 minutes at 200° C. to obtain a desired photomask.

This photosensitive material was evaluated under the following conditions, and the results are shown in Table 5.

<Evaluation of Developability>

A development process was carried out as described above, and the absence of a remaining film in the unexposed portion was evaluated as (+), while a remaining film observed in the unexposed portion was evaluated as (−).

<Sensitivity>

An exposure was made with a xenon exposure equipment, through a 532 nm band-pass filter and a step wedge, and an exposure amount providing two solid steps was defined as the sensitivity. A smaller figure indicates a higher sensitivity.

<Pencil Scratching Hardness>

A sample which had been heated at 200° C. for 30 minutes was evaluated by a pencil scratching hardness test according to the JIS-K5400.

<Pigment Dispersibility>

A dispersion, obtained under the dispersing condition for the green pigment (PG36) described in the Example 3, was spin coated on a glass plate at 1500 rpm, then the appearance after drying for 2 minutes at 100° C. was visually observed, and the specimen was evaluated as (+) if transparent, or as (−) if turbid.

Examples 4 to 7

Transfer materials were prepared and evaluated as in the Example 1 except that the terpolymer 1 of the Synthesis Example 1, employed in the colored photosensitive layer formulation, and the green and yellow pigment dispersions in the Example 1 was replaced by the terpolymers 2 to 5 of the Synthesis Examples 2 to 5. The obtained results are shown in Table 5.

Comparative Example 3

A transfer material was prepared and evaluated as in the Example 1 except that the terpolymer 1 of the Synthesis Example 1, employed in the colored photosensitive layer formulation, and the green and yellow pigment dispersions in the Example 1 was replaced by a benzyl methacrylate/methacrylic acid copolymer (molar ratio=73/27, molecular weight=30,000). The obtained results are shown in Table 5.

Comparative Examples 4 to 6

Transfer materials were prepared and evaluated as in the Example 1 except that the terpolymer 1 of the Synthesis Example 1, employed in the colored photosensitive layer formulation, and the green and yellow pigment dispersions in the Example 1 was replaced by the copolymers (or terpolymer) 6 to 8 of the Comparative Synthesis Examples 1 to 3. The obtained results are shown in

TABLE 5

| | Developability | Sensitivity | Pencil scratch hardness | Pigment dispersibility |
|---|---|---|---|---|
| Example 3 | + | 0.5 mj/cm² | 5 H | + |
| Example 4 | + | 0.5 mj/cm² | 5 H | + |
| Example 5 | + | 0.5 mj/cm² | 5 H | + |
| Example 6 | + | 0.7 mj/cm² | 5 H | + |
| Example 7 | + | 0.8 mj/cm² | 5 H | + |
| Comp. Ex. 3 | − | >2 mj/cm² | 5 H | − |
| Comp. Ex. 4 | + | 0.4 mj/cm² | 5 H | − |
| Comp. Ex. 5 | + | 0.7 mj/cm² | 5 H | − |
| Comp. Ex. 6 | + | >2 mj/cm² | 5 H | − |

What is claimed is:

1. An image forming method comprising the steps of: forming, on a transparent substrate, at least a layer including a colored photosensitive resin composition, and patternwise exposing and alkali developing;

wherein the colored photosensitive resin composition is a colored photosensitive resin composition for forming a colored image on a transparent substrate, the colored photosensitive resin composition comprising: an alkali-soluble binder, one of a monomer and an oligomer having at least two ethylenic unsaturated double bonds, one of a photopolymerization initiator and a photopolymerization initiating system, and a pigment, said alkali-soluble binder comprising a copolymer including a structural unit having a carboxyl group, a structural unit represented by the following general formula (1), and a structural unit comprising a (meth)acrylate having at least one of an aromatic ring and an alicyclic ring:

General formula (1)

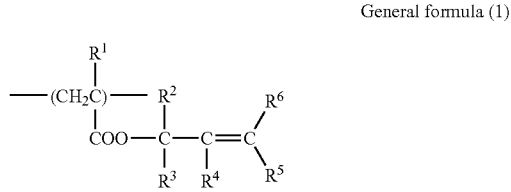

wherein $R^1$ represents one of a hydrogen atom and a methyl group; and each of $R^2$ to $R^6$ independently represents one of a hydrogen atom, a substituted and unsubstituted alkyl group, a substituted and unsubstituted aryl group, a halogen atom and a cyano group;

wherein said alkali-soluble binder comprises a copolymer including a structural unit having a carboxyl group in a range of 10 to 40 mol %, a structural unit represented by the general formula (1) in a range of 20 to 80 mol %, and a structural unit comprising a (meth)acrylate having at least one of an aromatic ring and an alicyclic ring in a range of 10 to 70 mol %;

wherein the method further comprises the step of heating said layer to a temperature range of 120° to 250° C. after the developing step.

2. An image forming method according to claim 1, wherein the layer including said colored photosensitive resin composition is formed by transferring at least the layer including the colored photosensitive resin composition of a photosensitive resin transfer material comprising: a temporary support, and a layer including the colored photosensitive resin composition.

3. An image forming method according to claim 2, further comprising, as said alkali-soluble binder, an alkali-soluble binder which does not include a polymerizable unsaturated double bond in a side chain.

4. An image forming method according to claim 2, wherein said alkali-soluble binder comprises a copolymer including (A) a structural unit derived from (meth)acrylic acid, (B) a structural unit derived from allyl(meth)acrylate, and (C) a structural unit comprising one selected from the group consisting of benzyl(meth)acrylate and cyclohexyl (meth)acrylate.

5. An image forming method according to claim 2, wherein said photopolymerization initiator comprises at least one of a halogenated hydrocarbon having a triazine skeleton, a halogenated hydrocarbon having an oxadiazole skeleton, a hexaarylbiimidazole, a titanocene derivative, and a phenylacridine derivative.

6. An image forming method according to claim 2, wherein said pigment is an organic pigment.

7. An image forming method according to claim 2, wherein, when dispersing said pigment, at least a part of the alkali-soluble binder is used as a dispersion medium.

8. An image forming method according to claim 2, wherein said pigment has an absorption in the ultraviolet region.

9. A method for producing a color filter comprising the steps of:

performing the image forming method according to claim 1 repeatedly, utilizing a plurality of layers including colored photosensitive resin compositions of different colors.

10. An image forming method according to claim 1, further comprising, as said alkali-soluble binder, an alkali-soluble binder which does not include a polymerizable unsaturated double bond in a side chain.

11. An image forming method according to claim 1, wherein said alkali-soluble binder comprises a copolymer including (A) a structural unit derived from (meth)acrylic acid, (B) a structural unit derived from allyl(meth)acrylate, and (C) a structural unit comprising one selected from the group consisting of benzyl(meth)acrylate and cyclohexyl (meth)acrylate.

12. An image forming method according to claim 1, wherein said photopolymerization initiator comprises at least one of a halogenated hydrocarbon having a triazine skeleton, a halogenated hydrocarbon having an oxadiazole skeleton, a hexaarylbiimidazole, a titanocene derivative, and a phenylacridine derivative.

13. An image forming method according to claim 1, wherein said pigment is an organic pigment.

14. An image forming method according to claim 1, wherein, when dispersing said pigment, at least a part of the alkali-soluble binder is used as a dispersion medium.

15. An image forming method according to claim 1, wherein said pigment has an absorption in the ultraviolet region.

16. A method for producing a photomask comprising the steps of:

forming, on a transparent substrate, a layer including a photosensitive resin composition, exposing the layer comprising said photosensitive resin composition to near ultraviolet or visible light, and developing the layer including the photosensitive resin composition to form an image;

wherein the colored photosensitive resin composition is a colored photosensitive resin composition for forming a colored image on a transparent substrate, the colored photosensitive resin composition comprising: an alkali-soluble binder, one of a monomer and an oligomer having at least two ethylenic unsaturated double bonds, one of a photopolymerization initiator and a photopolymerization initiating system, and a pigment, said alkali-soluble binder comprising a copolymer including a structural unit having a carboxyl group, a structural unit represented by the following general formula (1), and a structural unit comprising a (meth)acrylate having at least one of an aromatic ring and an alicyclic ring:

General formula (1)

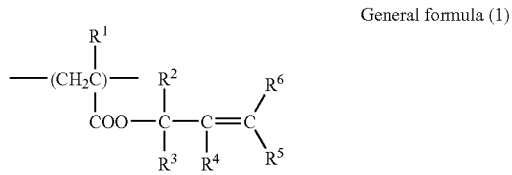

wherein $R^1$ represents one of a hydrogen atom and a methyl group: and each of $R^2$ to $R^6$ independently represents one of a hydrogen atom, a substituted and unsubstituted alkyl group, a substituted and unsubstituted aryl group, a halogen atom and a cyano group;

wherein said alkali-soluble binder comprises a copolymer including a structural unit having a carboxyl group in a range of 10 to 40 mol %, a structural unit represented by the general formula (1) in a range of 20 to 80 mol %, and a structural unit comprising a (meth)acrylate having at least one of an aromatic ring and an alicyclic ring in a range of 10 to 70 mol %:

wherein said pigment has an absorption in the ultraviolet region;

wherein the method further comprises the step of heating said layer to a temperature range of 120° to 250° C. after the developing step.

17. A method for producing a photomask according to claim 16,
wherein the layer including said photosensitive resin composition is formed by transferring at least a layer including the colored photosensitive resin composition of a photosensitive resin transfer material comprising: a temporary support, and a layer including the colored photosensitive resin composition.

18. A method for producing a photomask according to claim 16, wherein the absorbance of said layer in the near ultraviolet or visible region is smaller than the absorbance of said layer in the ultraviolet region.

19. A method for producing a photomask according to claim 16, wherein a defect portion in the produced photomask is repaired, (1) in a case of a void portion appearing in a black portion of the image, by forming a photosensitive resin layer which includes a pigment having an absorption in the ultraviolet region and which is sensitive to a near ultraviolet or visible light, and exposing the photosensitive resin layer to light and developing the photosensitive resin layer, and, (2) in a case of a defect portion appearing in a white portion of the image, by laser ablation.

20. A method for producing a photomask according to claim 16, wherein said exposure step is carried out with a laser beam in one of the near ultraviolet region and the visible region.

21. A method for producing a photomask according to claim 16, further comprising, as said alkali-soluble binder, an alkali-soluble binder which does not include a polymerizable unsaturated double bond in a side chain.

22. A method for producing a photomask according to claim 16, wherein said alkali-soluble binder comprises a copolymer including (A) a structural unit derived from (meth)acrylic acid, (B) a structural unit derived from allyl (meth)acrylate, and (C) a structural unit comprising one selected from the group consisting of benzyl(meth)acrylate and cyclohexyl(meth)acrylate.

23. A method for producing a photomask according to claim 16, wherein said photopolymerization initiator comprises at least one of a halogenated hydrocarbon having a triazine skeleton, a halogenated hydrocarbon having an oxadiazole skeleton, a hexaarylbiimidazole, a titanocene derivative, and a phenylacridine derivative.

24. A method for producing a photomask according to claim 16, wherein said pigment is an organic pigment.

25. A method for producing a photomask according to claim 16, wherein, when dispersing said pigment, at least a part of the alkali-soluble binder is used as a dispersion medium.

* * * * *